(12) United States Patent  
Cheng

(10) Patent No.: US 11,183,578 B2
(45) Date of Patent: Nov. 23, 2021

(54) CONTACT OVER ACTIVE GATE EMPLOYING A STACKED SPACER

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/672,801

(22) Filed: Nov. 4, 2019

(65) Prior Publication Data

US 2020/0066866 A1   Feb. 27, 2020

Related U.S. Application Data

(62) Division of application No. 15/949,634, filed on Apr. 10, 2018, now Pat. No. 10,573,724.

(51) Int. Cl.

| | |
|---|---|
| *H01L 29/51* | (2006.01) |
| *H01L 29/66* | (2006.01) |
| *H01L 29/49* | (2006.01) |
| *H01L 21/768* | (2006.01) |
| *H01L 21/764* | (2006.01) |

(52) U.S. Cl.
CPC .......... *H01L 29/515* (2013.01); *H01L 21/764* (2013.01); *H01L 21/7682* (2013.01);
(Continued)

(58) Field of Classification Search
CPC .......... H01L 29/0886; H01L 21/02271; H01L 21/31111; H01L 21/823418;
(Continued)

(56) References Cited

U.S. PATENT DOCUMENTS

| | | |
|---|---|---|
| 9,362,355 B1 | 6/2016 | Cheng et al. |
| 9,461,143 B2 | 10/2016 | Pethe et al. |
| | (Continued) | |

FOREIGN PATENT DOCUMENTS

KR   20010011638 A  *  2/2001

OTHER PUBLICATIONS

List of IBM Patents or Patent Applications Treated as Related dated Nov. 4, 2019, 2 pages.

(Continued)

*Primary Examiner* — Ermias T Woldegeorgis
(74) *Attorney, Agent, or Firm* — Tutunjian & Bitetto, P.C.; Randall Bluestone

(57) ABSTRACT

A method is presented for employing contact over active gate to reduce parasitic capacitance. The method includes forming high-k metal gates (HKMGs) between stacked spacers, the stacked spacers including a low-k dielectric lower portion and a sacrificial upper portion, forming a first dielectric over the HKMGs, forming first contacts to source/drain of a transistor between the HKMGs, and forming a second dielectric over the first contacts. The method further includes selectively removing the first dielectric to form second contacts to the HKMGs, selectively removing the second dielectric to form third contacts on top of the first contacts, removing the sacrificial upper portion of the stacked spacers, and depositing a third dielectric that pinches off the remaining first and second dielectrics to form air-gaps between the first contacts and the HKMGs.

20 Claims, 16 Drawing Sheets

(52) U.S. Cl.
CPC .. *H01L 21/76834* (2013.01); *H01L 21/76885* (2013.01); *H01L 21/76895* (2013.01); *H01L 21/76897* (2013.01); *H01L 29/4966* (2013.01); *H01L 29/4991* (2013.01); *H01L 29/6653* (2013.01); *H01L 29/6656* (2013.01); *H01L 29/66545* (2013.01)

(58) Field of Classification Search
CPC ..... H01L 21/823431; H01L 21/823468; H01L 29/45; H01L 29/4966; H01L 29/4991; H01L 29/6653; H01L 29/6656; H01L 29/66545
See application file for complete search history.

(56) References Cited

U.S. PATENT DOCUMENTS

| | | | |
|---|---|---|---|
| 9,536,988 | B1 | 1/2017 | Pranatharthiharan et al. |
| 9,608,065 | B1 * | 3/2017 | Bergendahl ......... H01L 27/0886 |
| 9,780,178 | B2 | 10/2017 | Xie et al. |
| 9,799,560 | B2 | 10/2017 | Song et al. |
| 9,824,921 | B1 * | 11/2017 | Labonte .............. H01L 29/7851 |
| 9,853,110 | B2 | 12/2017 | Zhang et al. |
| 9,871,121 | B2 | 1/2018 | Xu et al. |
| 2012/0025328 | A1 | 2/2012 | Luo et al. |
| 2016/0308008 | A1 | 10/2016 | Yeo et al. |
| 2018/0122919 | A1 * | 5/2018 | Park .................. H01L 29/66545 |

OTHER PUBLICATIONS

Office Action with cited art in corresponding U.S. Appl. No. 16/672,789 dated Feb. 16, 2021.

Final Office Action in corresponding U.S. Appl. No. 16/672,789 dated Aug. 26, 2021 (16 pages).

\* cited by examiner

US 11,183,578 B2

CONTACT OVER ACTIVE GATE EMPLOYING A STACKED SPACER

BACKGROUND

Technical Field

The present invention relates generally to semiconductor devices, and more specifically, to forming a contact over active gate employing a stacked spacer to reduce parasitic capacitance.

Description of the Related Art

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming.

SUMMARY

In accordance with an embodiment, a method is provided for employing contact over active gate to reduce parasitic capacitance. The method includes forming high-k metal gates (HKMGs) between stacked spacers, the stacked spacers including a low-k dielectric lower portion and a sacrificial upper portion, forming a first dielectric over the HKMGs, forming first contacts to a source/drain of a transistor between the HKMGs, forming a second dielectric over the first contacts, selectively removing the first dielectric to form second contacts to the HKMGs, selectively removing the second dielectric to form third contacts on top of the first contacts, removing the sacrificial upper portion of the stacked spacers, and depositing a third dielectric that pinches off the remaining first and second dielectrics to form air-gaps between the first contacts and the HKMGs.

In accordance with another embodiment, a method is provided for reducing parasitic capacitance. The method includes forming high-k metal gates (HKMGs) between spacers having an upper portion and a lower portion, forming metal gate caps over the HKMGs, forming first contacts to the source/drain of a transistor between the HKMGs, forming dielectric caps over the first contacts, selectively removing the metal gate caps to form second contacts to the HKMGs, selectively removing the dielectric caps to form third contacts on top of the first contacts, removing the upper portion of the spacers to form openings, and depositing a dielectric in the openings to form air-gap spacers with gate contact over active device region.

In accordance with yet another embodiment, a semiconductor structure is presented for employing contact over active gate to reduce parasitic capacitance. The semiconductor structure includes high-k metal gates (HKMGs) disposed between stacked spacers, the stacked spacers including a low-k dielectric lower portion and a sacrificial upper portion, a first dielectric disposed over the HKMGs, first contacts to source/drain of a transistor located between the HKMGs, a second dielectric disposed over the first contacts, second contacts and third contacts created after selective removal of the first and second dielectrics, respectively, and a third dielectric disposed over the remaining first and second dielectrics to create air-gaps between the first contacts and the HKMGs.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
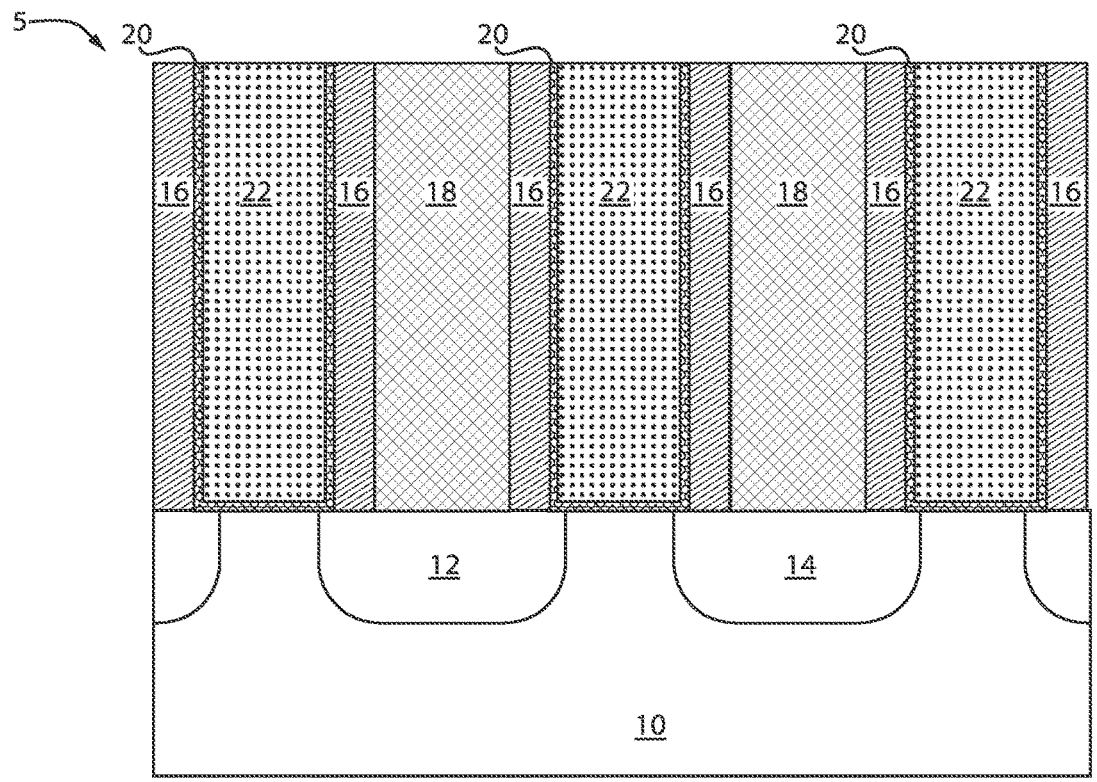
FIG. 1 is a cross-sectional view of a semiconductor structure including a high-k metal gate (HKMG) formed over a semiconductor substrate, in accordance with an embodiment of the present invention.

Embodiments in accordance with the present invention provide methods and devices for reducing parasitic capacitance between, e.g., gate structures and source/drain regions (or TS contacts). In electrical circuits, parasitic capacitance is unwanted capacitance that exists between parts of an electronic component or circuit simply because of their proximity to each other. When two electrical conductors at different voltages are close together, the electric field between them causes electric charge to be stored thereon, which is referred to as parasitic capacitance. Therefore, reducing parasitic capacitance remains a focus for advanced technology node development. The exemplary embodiments provide for air-gaps that can be created and incorporated into semiconductor manufacturing technology to reduce parasitic capacitance.

Embodiments in accordance with the present invention provide methods and devices for forming transistors with contact over active gate (COAG) by employing a stacked spacer in order to create air-gaps between the metal gates and TS contacts. A top portion of the stacked spacer can be a sacrificial spacer including a semiconductor, whereas a bottom portion of the stacked spacer can be a low-k dielectric. Due to excellent etch selectivity between dielectric materials (metal gate cap and TS cap), the sacrificial spacer ensures physical isolation between CA and CB contacts. After the formation of the CA and CB contacts, the sacrificial spacer of the stacked spacer is removed. A dielectric deposition is performed to fill the spacer openings to create air-gaps or air spacers, thus reducing the parasitic capacitance between the metal gates and the TS contacts. As a result, the sacrificial spacer of the stacked spacer can enable gate contact over active with improved process margin and act as a placeholder for forming the air-gaps or air spacers.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a high-k metal gate (HKMG) formed over a semiconductor substrate, in accordance with an embodiment of the present invention.

In a replacement gate fabrication approach, a dummy gate (e.g., polysilicon gate) is formed over an etch stop layer in contact with a single-crystal semiconductor region of a substrate, a pair of spacers being disposed on sidewalls of the gate. The etch stop layer is usually a thin layer of silicon dioxide which is grown thermally on the surface of the substrate in an oxygen ambient. In such case, the etch stop layer can be referred to as a sacrificial gate oxide layer. Later, the polysilicon gate material is removed from between the pair of spacers, as by an anisotropic vertical etch process such as a reactive ion etch (RIE), or an isotropic etch process such as a wet etch process containing ammonia, or a combination of anisotropic process and isotropic process, stopping on the etch stop layer. The etch stop layer is then cleared from the surface of the substrate as by a dry etch or an isotropic wet etch selective to the material of the sidewall spacers. This creates an opening between the spacers where a gate dielectric, usually a high-k dielectric material (k stands for dielectric constant), is then formed. Thereafter, a metal gate is formed in the opening between the spacers contacting the gate dielectric underneath. The semiconductor structure 5 is formed after the replacement gate fabrication has been completed.

The structure 5 includes source region 12 and drain region 14 formed within a substrate 10. High-k metal gates (HKMG) 20, 22 are formed over the substrate 10. Spacers 16 are formed adjacent the HKMG 20, 22 and an interlayer dielectric (ILD) layer 18 is formed between the spacers 16. The gate dielectric 20 includes any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric can have a thickness ranging from about 1 nm to about 5 nm, although less thickness and greater thickness are also conceived.

The gate conductor 22 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g., Ti3Al, ZrAl), TaC, TaMgC, carbon nanotube, conductive carbon, graphene, or any suitable combination of these materials. The conductive material 22 can further include dopants that are incorporated during or after deposition. In some embodiments, the gate can further include a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor 22 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The semiconductor substrate 10 that is employed in the present application can include any semiconductor material. Illustrative examples of semiconductor materials that can be used for the semiconductor substrate 10 include, but are not limited to, Si, SiGe alloys, SiGeC, SiC, Ge alloy, GaSb, GaP, GaN, GaAs, InAs, INP, AlN and all other III-V or II-VI compound semiconductors. In one embodiment, the semiconductor substrate 10 can include a multilayered stack of such semiconductor materials. In some embodiments, the semiconductor substrate 10 can include a bulk semiconductor substrate. By "bulk" it is meant the entirety of the semiconductor substrate 10 from one surface to an opposite surface is composed of a semiconductor material. In other embodiments, the semiconductor substrate 10 can include a semiconductor-on-insulator (SOI) substrate including a handle substrate, a buried insulator layer and a top semiconductor material layer.

Source/drain 12, 14 include a first source side 12 formed on one side of the gate electrode 22 and a drain side 14 formed on the other side of the gate electrode 22. The source/drain 12, 14 usually include doped semiconductor materials such as epitaxial silicon, silicon germanium (SiGe), germanium (Ge), and/or carbon doped silicon (Si:C). Dopants are incorporated during epitaxy (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$. The depth of the first source/drain 12, 14 can be from about 10 nm to about 150 nm, and usually from about 20 nm to about 100 nm, although lesser and greater depths are contemplated herein also. Source/drain can also be formed by any other suitable doping technique, including but not limited to, ion implantation, gas phase doping, plasma doping, plasma immersion ion implantation, cluster doping, infusion doping, liquid phase doping, solid phase doping, etc.

In various exemplary embodiments, spacers 16 are shown formed adjacent the HKMG 20, 22. The spacers 16 can be formed by first providing a spacer material and then etching the spacer material. The spacer material can include any dielectric spacer material including, for example, a dielectric oxide, dielectric nitride, and/or dielectric oxynitride. In one example, the spacer material can include SiOCN, SiON, SiBCN, SiOC, or SiBN. The spacer material can be provided by a deposition process including, for example, chemical vapor deposition (CVD), atomic layer deposition (ALD), plasma enhanced chemical vapor deposition (PECVD), or physical vapor deposition (PVD). The etching of the spacer material can include a dry etch process such as, for example, a reactive ion etch (RIE). In some embodiments, the spacers 16 can have a thickness within the range of about 2-10 nm. Spacers 16 can be referred to as low-k spacers.

In various exemplary embodiments, an oxide fill takes place. The ILD oxide 18 can be planarized. The height of the ILD oxide 18 can be reduced by chemical-mechanical polishing (CMP) and/or etching. Therefore, the planarization process can be provided by CMP. Other planarization process can include grinding and polishing. In some embodiments, ILD 18 includes a dielectric liner (e.g., silicon nitride) on sidewalls and bottom of ILD oxide.

In one or more embodiments, the ILD 18 can have a thickness in the range of about 10 nm to about 100 nm, or in the range of about 10 nm to about 50 nm.

The ILD 18 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H. Additional choices for the ILD 18 include any of the aforementioned materials in porous form, or in a form that changes during processing to or from being porous and/or permeable to being non-porous and/or non-permeable.

Figure 2:
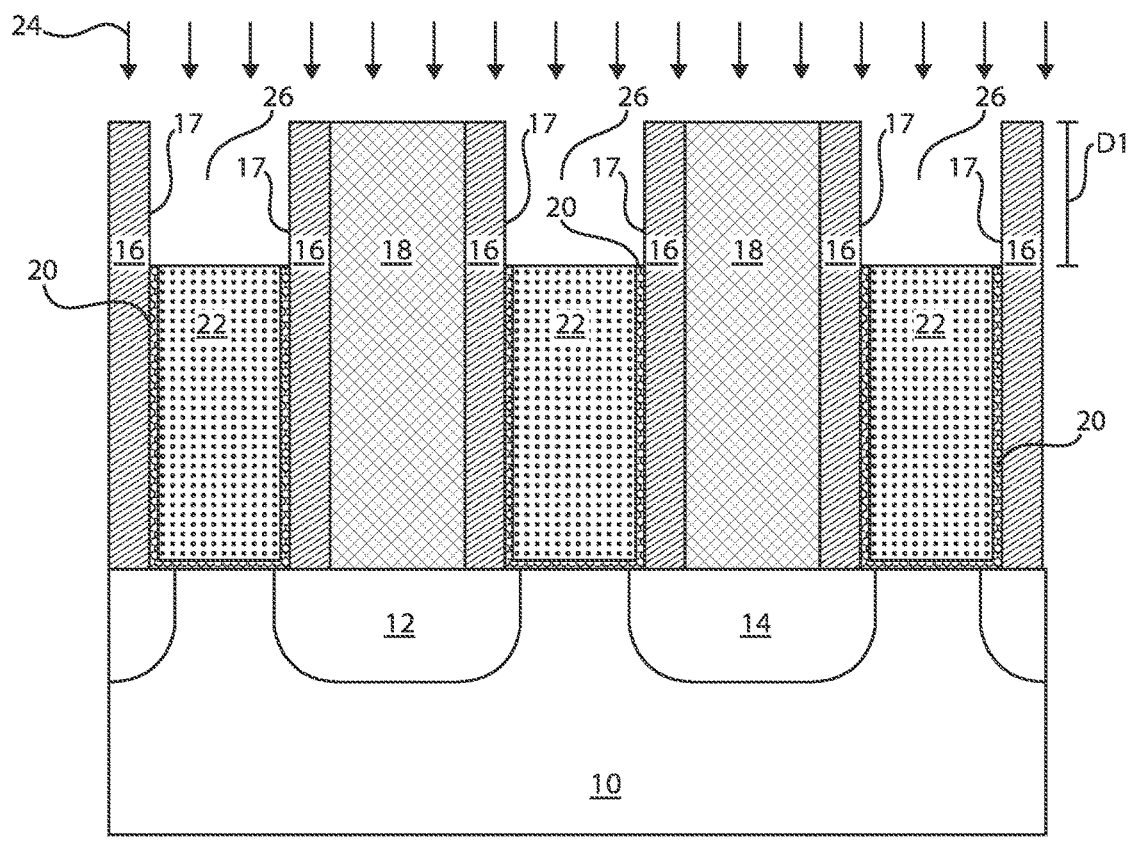
FIG. 2 is a cross-sectional view of the semiconductor structure of FIG. 1 where the HKMG is recessed, in accordance with an embodiment of the present invention.

FIG. 2 is a cross-sectional view of the semiconductor structure of FIG. 1 where the HKMG is recessed, in accordance with an embodiment of the present invention.

In various exemplary embodiments, the HKMG 20, 22 is recessed by, e.g., RIE 24, to form openings 26 between top portions of the spacers 16. This results in sidewalls 17 of the spacers 16 being exposed. The HKMG 20, 22 can be recessed by, e.g., a distance D1. Alternatively, HKMG 20, 22 can be recessed by a combination of any suitable dry etch process and wet etch process.

Figure 3:
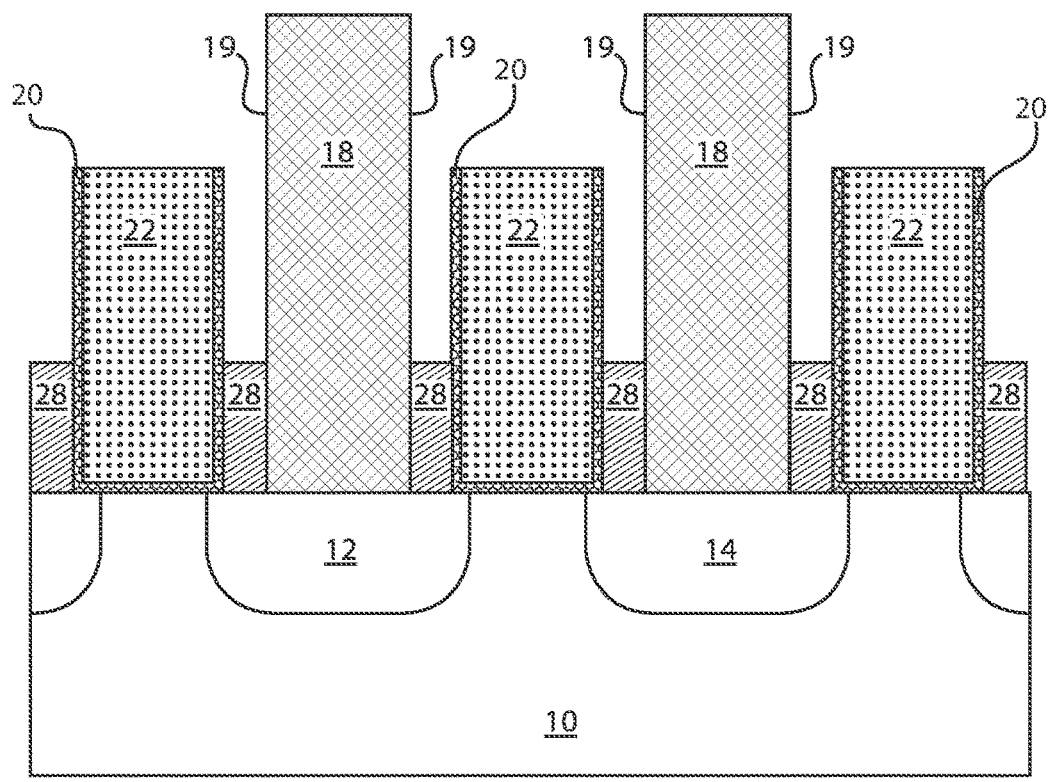
FIG. 3 is a cross-sectional view of the semiconductor structure of FIG. 2 where spacers formed adjacent the HKMG are recessed, in accordance with an embodiment of the present invention.

FIG. 3 is a cross-sectional view of the semiconductor structure of FIG. 2 where spacers formed adjacent the HKMG are recessed, in accordance with an embodiment of the present invention.

In various exemplary embodiments, the spacers 16 are etched by, e.g., an isotropic etch to form recessed spacers 28. Thus, a lower section of spacers 16 remains.

Figure 4:
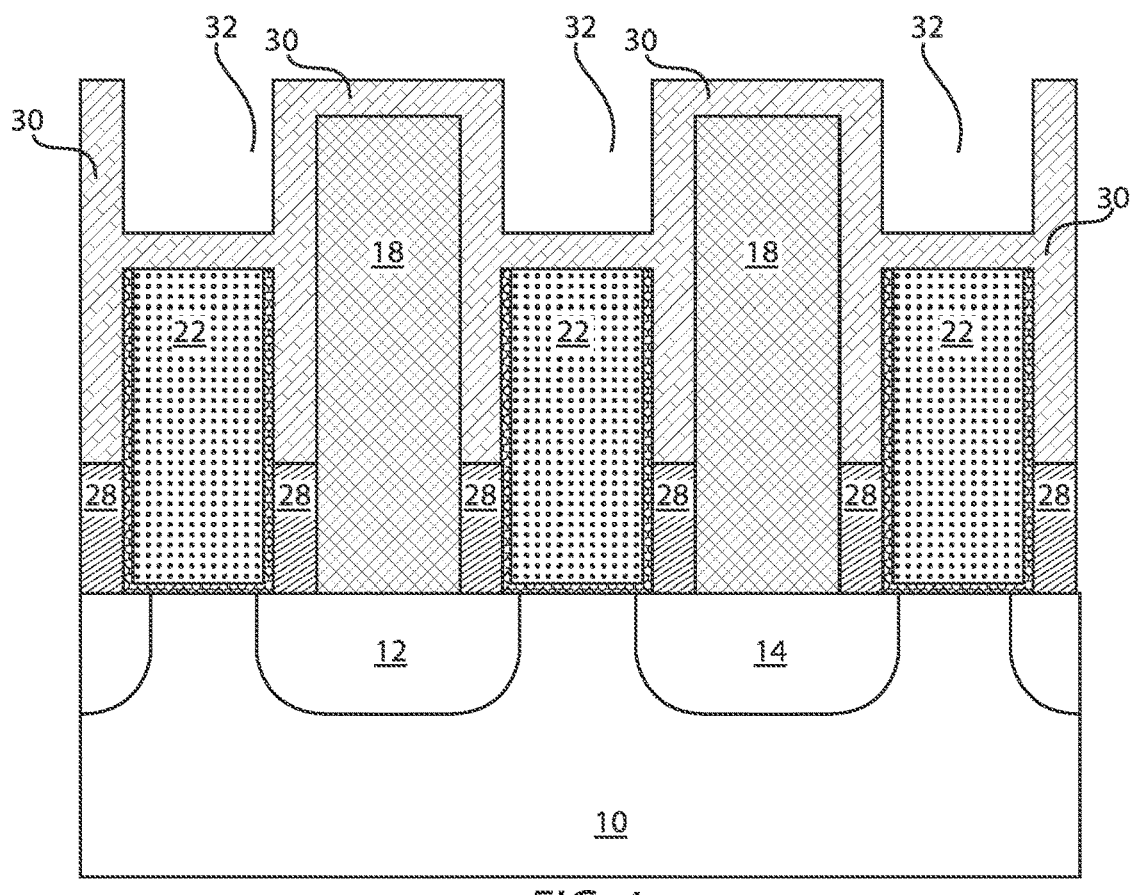
FIG. 4 is a cross-sectional view of the semiconductor structure of FIG. 3 where a sacrificial material is deposited over the HKMG and interlayer dielectric (ILD) portions, in accordance with an embodiment of the present invention.

FIG. 4 is a cross-sectional view of the semiconductor structure of FIG. 3 where a sacrificial material is deposited over the HKMG and interlayer dielectric (ILD) portions, in accordance with an embodiment of the present invention.

In various exemplary embodiments, a sacrificial material 30 can be conformally deposited over the HKMG 20, 22, over the ILDs 18, and over the recessed spacers 28. The deposition of the sacrificial material 30 results in gaps or openings 32 formed over the HKMGs 20, 22. The sacrificial material 30 can be formed, e.g., from amorphous silicon (a-Si). The a-Si provides for good etch selectivity to the later formed gate cap and TS cap. Additionally, a-Si is advantageous in pinching off the gaps or divots between the metal gate and the ILD. In various exemplary embodiments, the amorphous silicon is deposited by CVD or ALD process.

Figure 5:
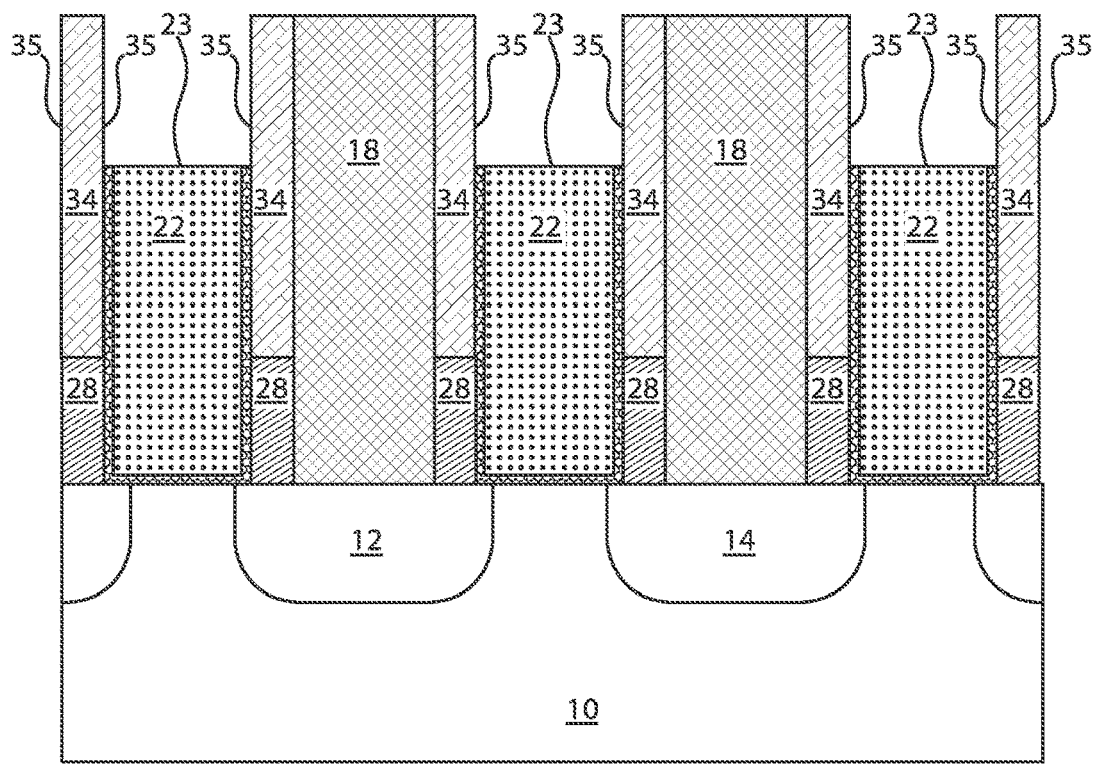
FIG. 5 is a cross-sectional view of the semiconductor structure of FIG. 4 where the sacrificial material is selectively etched to form sacrificial spacers adjacent the HKMG, in accordance with an embodiment of the present invention.

FIG. 5 is a cross-sectional view of the semiconductor structure of FIG. 4 where the sacrificial material is selectively etched to form sacrificial spacers adjacent the HKMG, in accordance with an embodiment of the present invention.

In various exemplary embodiments, a portion of the sacrificial material 30 is selectivity etched. The portion of the sacrificial material 30 that is etched is located directly above the HKMGs 20, 22. This etching results in sacrificial spacers 34 formed over the recessed low-k spacers 28. The etching further results in the exposure of the top surface 23 of the metal gate 22 and sidewalls 35 of the sacrificial spacers 34. The etching can be, e.g., an RIE. The sacrificial spacers 34 are, e.g., a-Si spacers. The structure of the sacrificial upper spacer 34 over the low-k lower spacer 28 can be referred to as a stacked spacer (or spacer formed of dual materials). The low-k dielectric lower portion spacer 28 defines a first length and the sacrificial upper portion spacer 34 defines a second length, where the second length is greater than the first length. In other words, the sacrificial spacer 34 is larger than the low-k spacer 28. In one example, the sacrificial spacer 34 can be more than twice the length of the low-k spacer 28.

Figure 6:
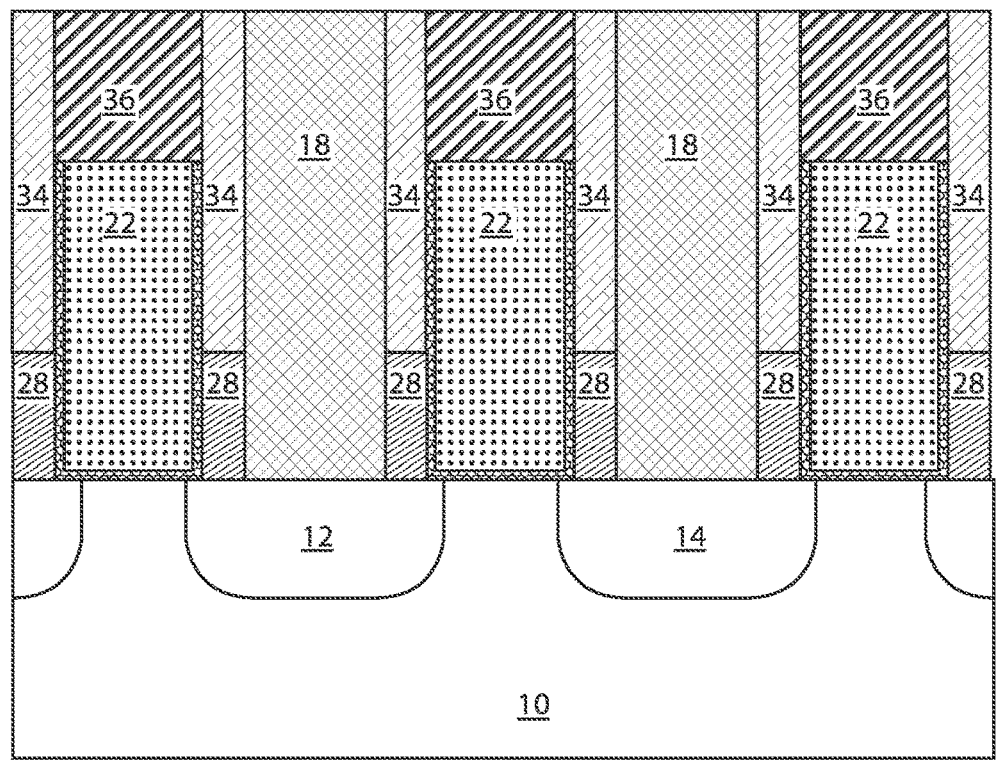
FIG. 6 is a cross-sectional view of the semiconductor structure of FIG. 5 where a first dielectric is deposited over the HKMG to form metal gate caps, in accordance with an embodiment of the present invention.

FIG. 6 is a cross-sectional view of the semiconductor structure of FIG. 5 where a first dielectric is deposited over the HKMG to form metal gate caps, in accordance with an embodiment of the present invention.

In various exemplary embodiments, a first dielectric 36 is formed over the HKMG 20, 22. The first dielectric 36 can be referred to as a metal gate cap. The first dielectric 36 can be formed, e.g., from silicon nitride (SiN). A height of the first dielectric 36 can be reduced by chemical-mechanical polishing (CMP) and/or etching. Therefore, the planarization process can be provided by CMP. Other planarization processes can include grinding and polishing.

Figure 7:
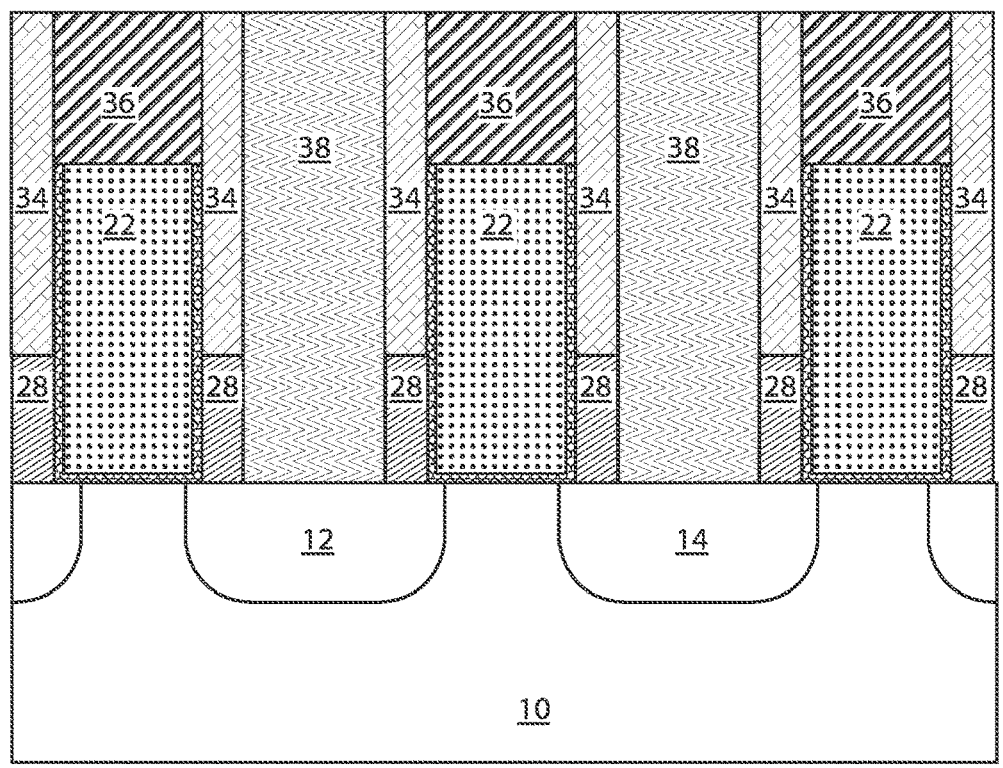
FIG. 7 is a cross-sectional view of the semiconductor structure of FIG. 6 where the ILD is etched and replaced with source/drain contacts (TS contacts), in accordance with an embodiment of the present invention.

FIG. 7 is a cross-sectional view of the semiconductor structure of FIG. 6 where the ILD is etched and replaced with source/drain contacts (TS contacts), in accordance with an embodiment of the present invention.

In various exemplary embodiments, the ILD 18 is stripped and replaced with source/drain contacts 38. The source/drain contacts can be referred to as TS contacts 38. TS contacts 38 can be formed by any suitable processes such as patterning, etching, depositing. TS contacts 38 can include any suitable conducting materials, including but not limited to tungsten (W), cobalt (Co), copper (Cu), nickel (Ni), titanium (Ti), tantalum (Ta), ruthenium (Ru), or any suitable combination of those materials. The TS contacts may further include depositing a conducting liner (e.g., titanium nitride (TiN), or tantalum nitride (TaN)) on TS trench sidewalls after removing ILD dielectric. A height of the TS contacts 38 can be reduced by chemical-mechanical polishing (CMP) and/or etching. Therefore, the planarization process can be provided by CMP. Other planarization processes can include grinding and polishing.

Figure 8:
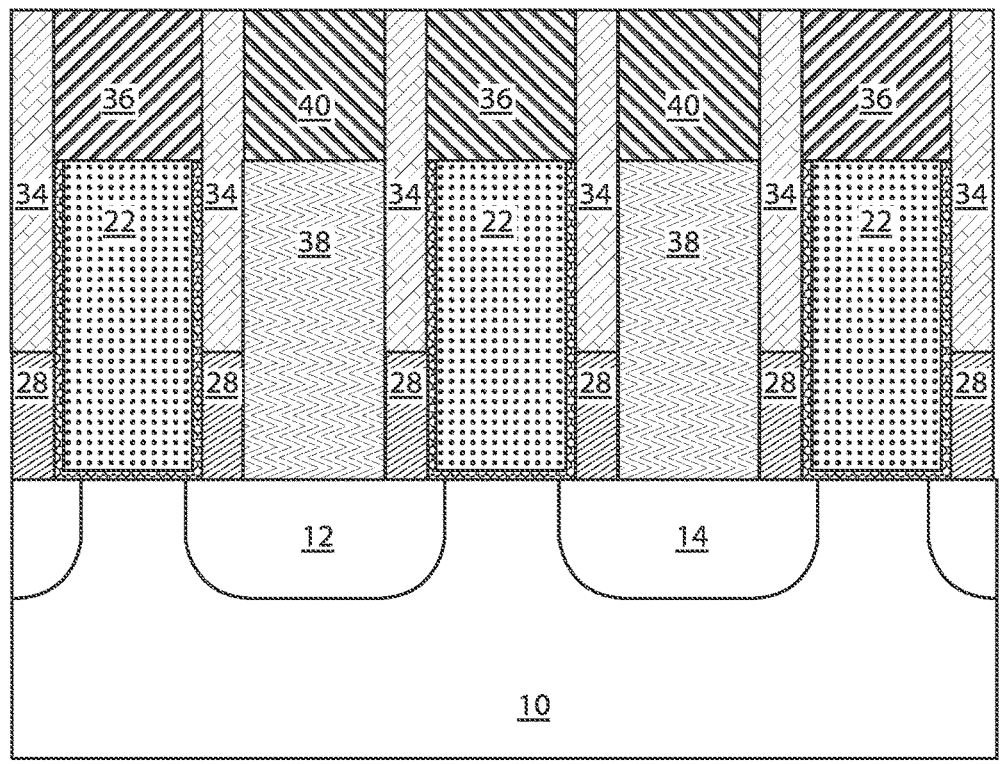
FIG. 8 is a cross-sectional view of the semiconductor structure of FIG. 7 where a second dielectric is deposited over the TS contacts to form dielectric caps, in accordance with an embodiment of the present invention.

FIG. 8 is a cross-sectional view of the semiconductor structure of FIG. 7 where a second dielectric is deposited over the TS contacts to form dielectric caps, in accordance with an embodiment of the present invention.

In various exemplary embodiments, a second dielectric 40 is formed over the TS contacts 38. The second dielectric 40 can be referred to as a TS cap. The TS contacts 38 are first recessed in order to accommodate the second dielectric 40. A height of the second dielectric 40 can be reduced by chemical-mechanical polishing (CMP) and/or etching. Therefore, the planarization process can be provided by CMP. Other planarization processes can include grinding and polishing.

The second dielectric 40 can include a low-k dielectric material (e.g., SiON, SiOCN, SiOC, SiBCN, SiC). The thickness of the first dielectric 36 (metal gate cap) can be approximately equal to the thickness of the second dielectric 40 (TS cap). However, one skilled in the art can contemplate the first and second dielectrics 36, 40 having different thicknesses. In other words, the TS caps and the metal gate caps need not have comparable thicknesses. Thus, the first dielectric can have a first thickness and the second dielectric can have a second thickness, the first and second thickness being different from each other. The first and second dielectrics 36, 40 can be formed by thermal oxidation, plasma oxidation, ozone oxidation, thermal nitridation, plasma nitridation, chemical vapor deposition (CVD), plasma enhanced chemical vapor deposition (PECVD), physical vapor deposition (PVD), high-density plasma CVD. In one example embodiment, the first and second dielectrics 36, 40 can have a thickness of about 5 nm to about 50 nm, or about 10 nm to about 30 nm.

Figure 9:
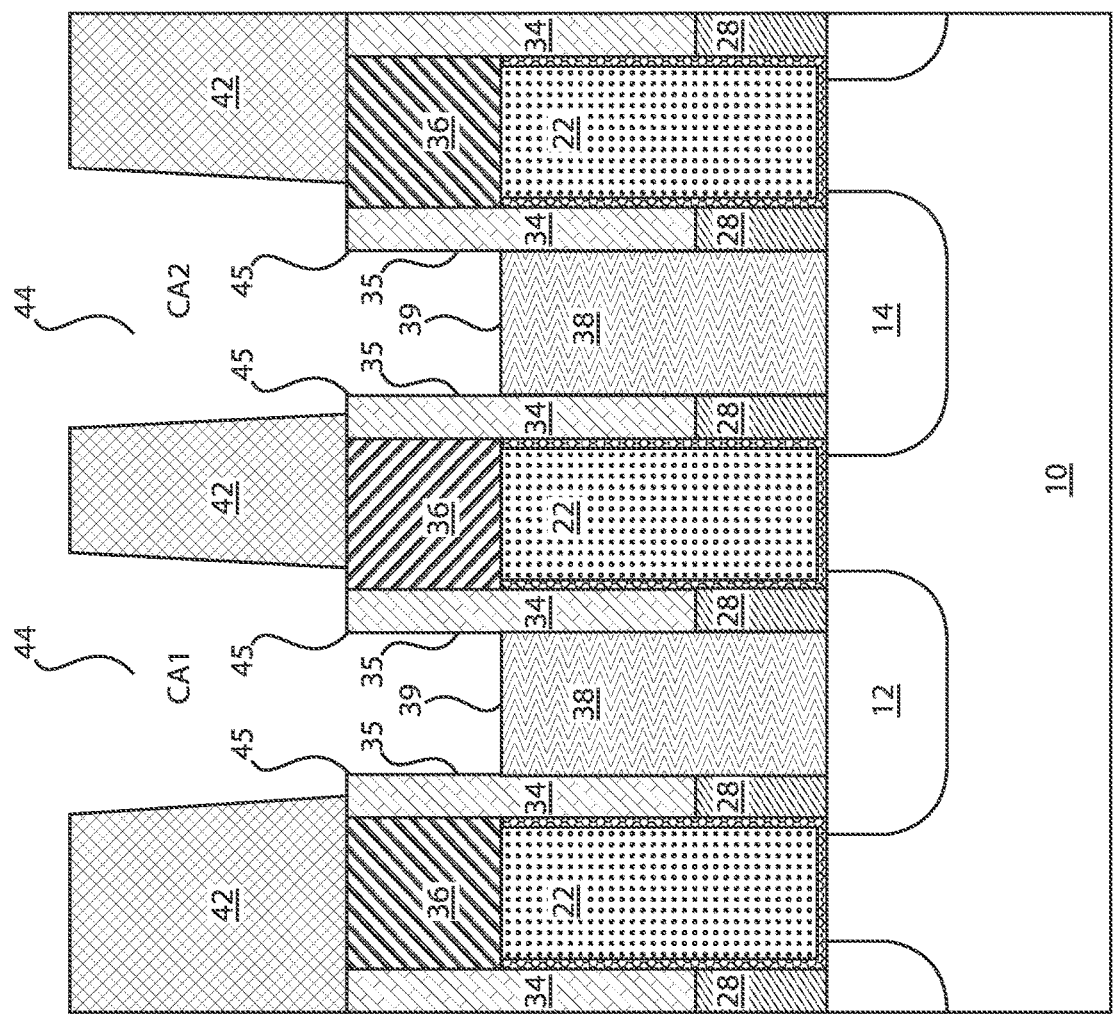
FIG. 9 is a cross-sectional view of the semiconductor structure of FIG. 8 where an ILD is deposited and the second dielectric caps are removed to expose a top surface of the TS contacts along axis A-A, in accordance with an embodiment of the present invention.

FIG. 9 is a cross-sectional view of the semiconductor structure of FIG. 8 where an ILD is deposited and the second dielectric caps are removed to expose a top surface of the TS contacts along axis A-A, in accordance with an embodiment of the present invention.

In various exemplary embodiments, an ILD 42 is formed over the structure. Openings 44 are then formed to access the top surface 39 of the TS contacts 38. Openings 44 can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used. Additionally, the sidewalls 35 of the sacrificial spacers 34 are exposed. It is also noted that the corners 45 of the sacrificial spacers 34 remain substantially intact, thanks to high etch selectivity between the sacrificial spacer material (e.g., amorphous silicon) and dielectric materials including ILD dielectric (e.g., oxide) and TS dielectric cap material (e.g., SiC). In other words, the sacrificial spacers 34 experience minimum or insignificant erosion issues.

This step can refer to the CA contacts patterning. For example, during front end-of-the-line processing, a plurality of semiconductor devices (e.g., transistors, resistors, capacitors, and the like) are formed on a semiconductor wafer. The semiconductor devices are then locally interconnected during middle-of-the-line (MEOL) processing to produce an integrated circuit, such as a logic circuit or a memory cell. To enable the local interconnection of the semiconductor devices during MEOL processing, device-level plugs are formed in ohmic contact with the electrically-active areas of the substrate (commonly designated as "RX") and the gate conductors (commonly designated as "PC"), and local interconnect lines are formed in ohmic contact with the device-level plugs. In many cases, such as in certain replacement gate-based processes, the local interconnect lines and device-level plugs can be divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts." The TS contacts can be referred to as contacts to source/drain of a transistor, CB contacts can be referred to as contacts to metal gates, and CA contacts can be referred to as contacts on top of TS contacts. In FIG. 9, local contacts CA1 and CA2 are shown.

Figure 10:
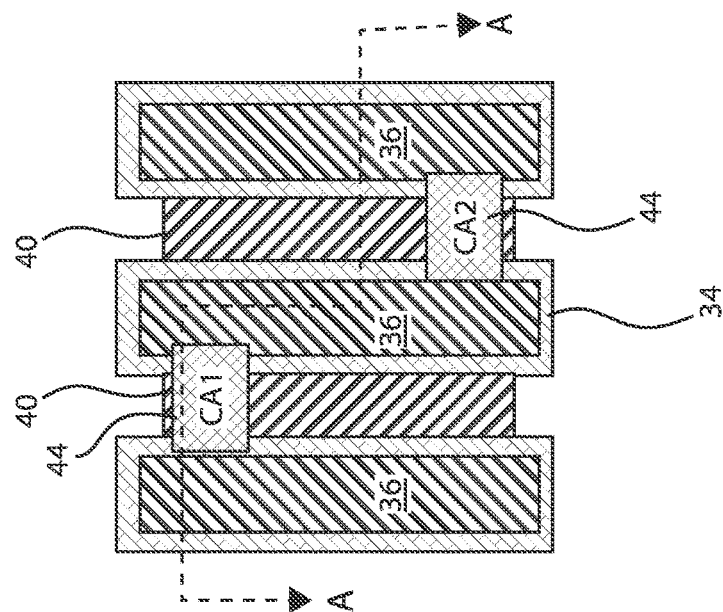
FIG. 10 is a top view of FIG. 9 illustrating the CA1 and CA2 contacts, in accordance with an embodiment of the present invention.

FIG. 10 is a top view of FIG. 9 illustrating the CA1 and CA2 contacts, in accordance with an embodiment of the present invention.

The top view illustrates the openings 44 for the CA1 and CA2 contacts.

Figure 11:
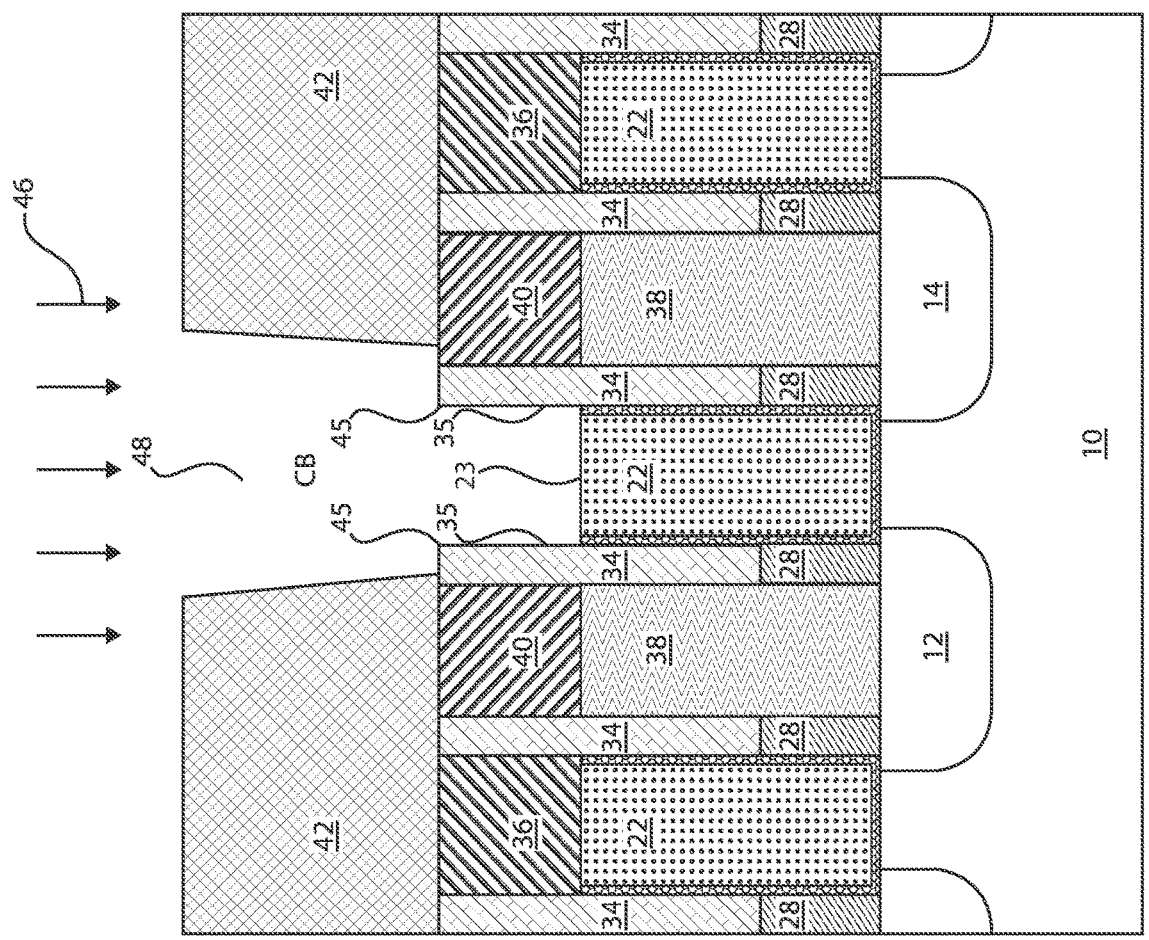
FIG. 11 is a cross-sectional view of the semiconductor structure of FIG. 8 where an ILD is deposited and the first dielectric cap is removed to expose a top surface of a HKMG along axis B-B, in accordance with an embodiment of the present invention.

FIG. 11 is a cross-sectional view of the semiconductor structure of FIG. 8 where an ILD is deposited and the first dielectric cap is removed to expose a top surface of a HKMG along axis B-B, in accordance with an embodiment of the present invention.

In various exemplary embodiments, an ILD 42 is formed over the structure. Openings 48 are then formed via etching 46 to access the top surface 23 of the HKMG 20, 22. Additionally, the sidewalls 35 of the sacrificial spacers 34 are exposed. It is also noted that the corners 45 of the sacrificial spacers 34 remain intact. In other words, the sacrificial spacers 34 experience no erosion issues. This step can refer to the CB contacts patterning. Openings 48 can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used. Additionally, the sidewalls 35 of the sacrificial spacers 34 are exposed. It is also noted that the corners 45 of the sacrificial spacers 34 remain substantially intact, thanks to high etch selectivity between the sacrificial spacer material (e.g., amorphous silicon) and dielectric materials including ILD dielectric (e.g., oxide) and gate dielectric cap material (e.g., SiN). In other words, the sacrificial spacers 34 experience minimum or insignificant erosion issues.

Figure 12:
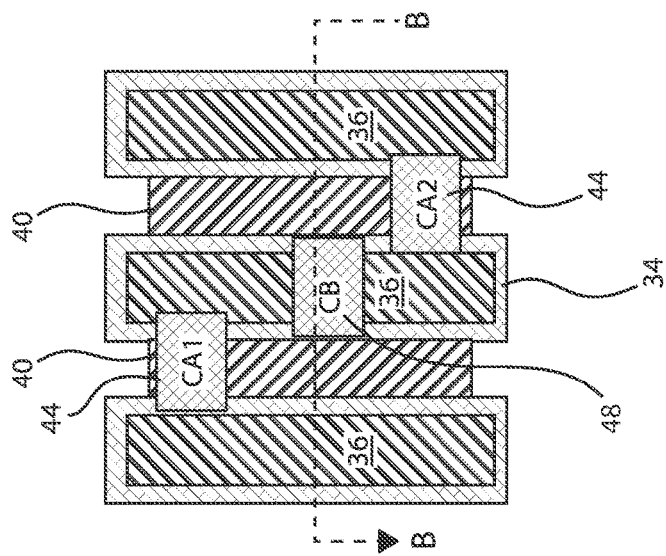
FIG. 12 is a top view of FIG. 11 illustrating the CB contact, in accordance with an embodiment of the present invention.

FIG. 12 is a top view of FIG. 11 illustrating the CB contact, in accordance with an embodiment of the present invention.

The top view illustrates the opening 48 for the CB contact.

Figure 13:
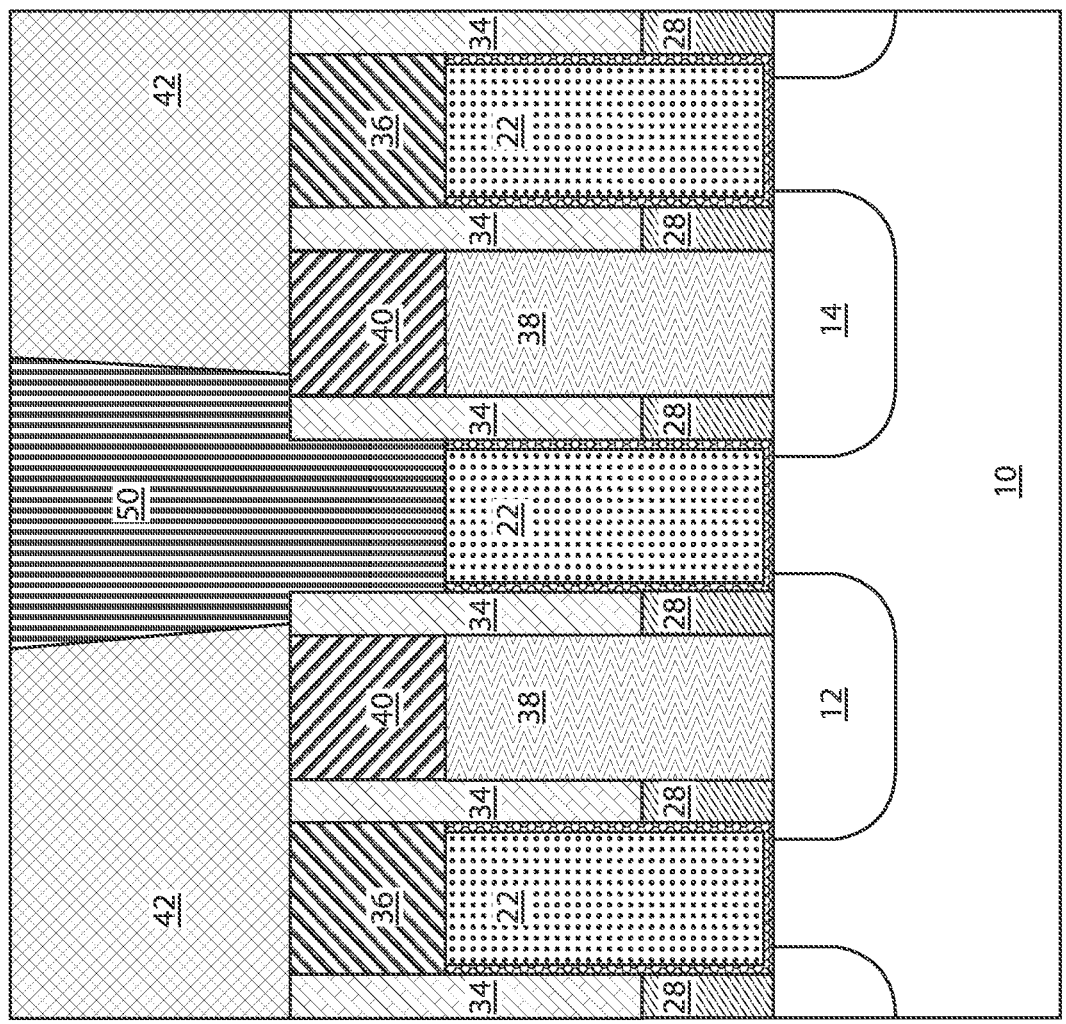
FIG. 13 is a cross-sectional view of the semiconductor structure of FIG. 11 where a metal fill takes place to form the CB contact along axis B-B, in accordance with an embodiment of the present invention.

FIG. 13 is a cross-sectional view of the semiconductor structure of FIG. 11 where a metal fill takes place to form the CB contact along axis B-B, in accordance with an embodiment of the present invention.

In various exemplary embodiments, a metal fill takes place. The conducting material 50 can be referred to as a metal fill. The metal fill 50 can be any suitable conducting material, including but not limited to, e.g., tungsten (W), cobalt (Co), copper (Cu), nickel (Ni), titanium (Ti), tantalum (Ta), ruthenium (Ru), or any suitable combination of those materials. A liner material (e.g., titanium nitride (TiN), or tantalum nitride (TaN)) can be deposited on the sidewalls of CA and CB openings first before metal fill. The top surface of the metal fill 50 can be flush with the top surface of the ILD 42, for example, by CMP. The metal fill 50 directly contacts the top surface of the HKMGs 20, 22 and the sidewalls of the sacrificial spacers 34.

Figure 14:
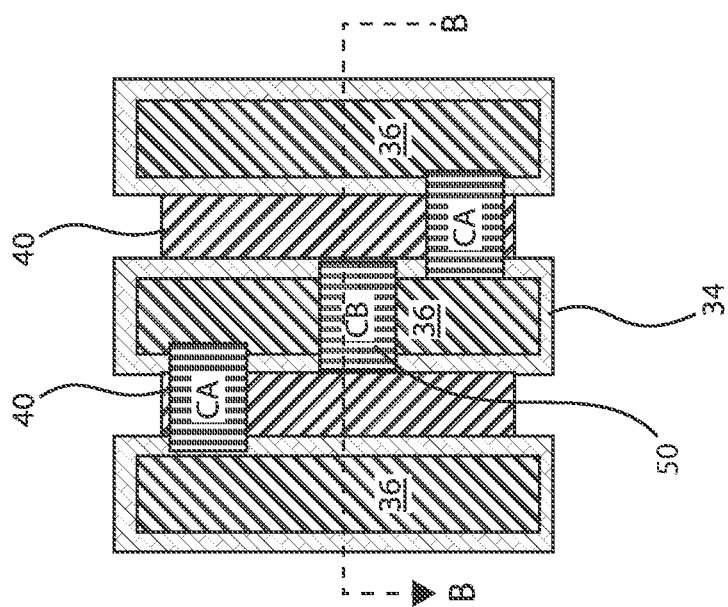
FIG. 14 is a top view of FIG. 13 illustrating the metal fill, in accordance with an embodiment of the present invention.

FIG. 14 is a top view of FIG. 13 illustrating the metal fill, in accordance with an embodiment of the present invention.

The top view illustrates the metal fill 50 for the CB contact.

Figure 15:
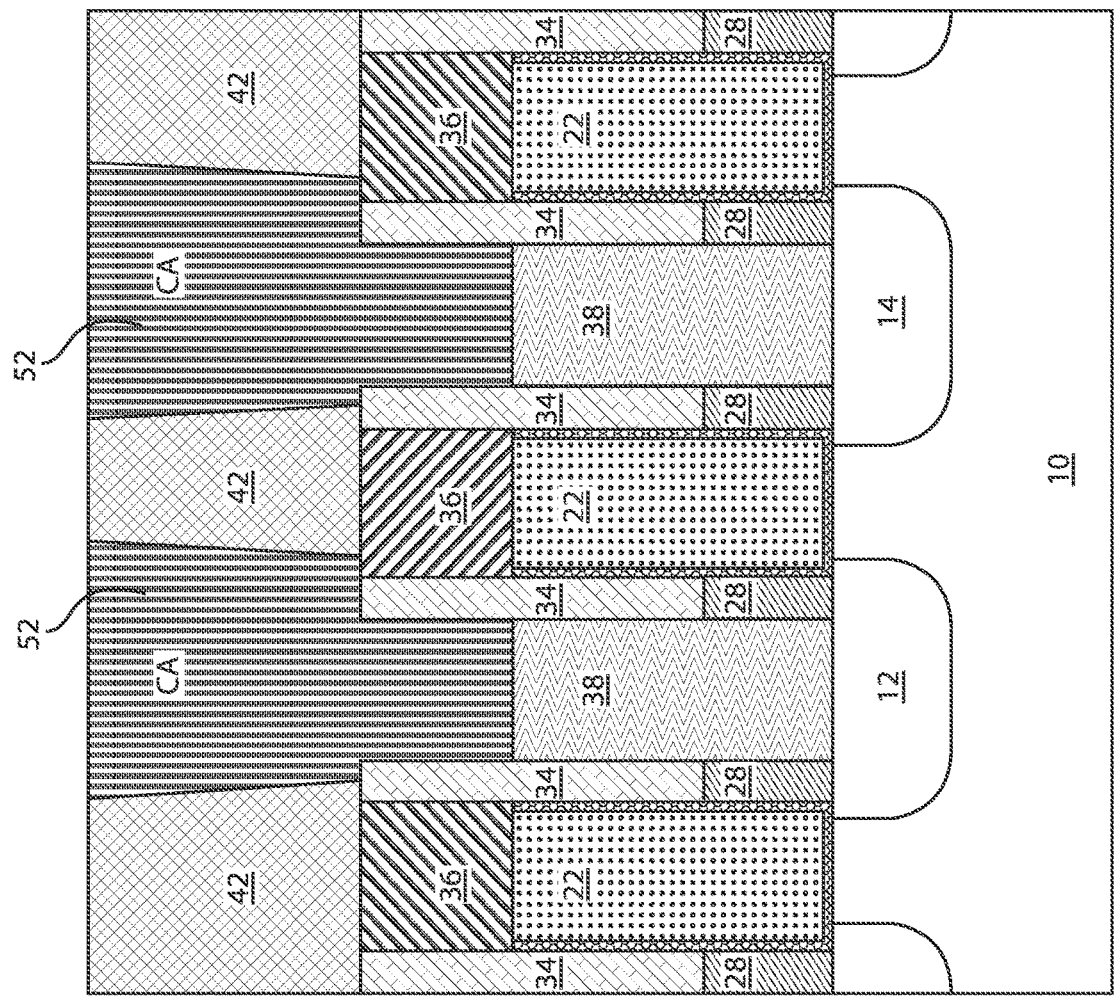
FIG. 15 is a cross-sectional view of the semiconductor structure of FIG. 9 where a metal fill takes place to form the CA1 and CA2 contacts along axis A-A, in accordance with an embodiment of the present invention.

FIG. 15 is a cross-sectional view of the semiconductor structure of FIG. 9 where a metal fill takes place to form the CA1 and CA2 contacts along axis A-A, in accordance with an embodiment of the present invention.

In various exemplary embodiments, a metal fill takes place. The conducting material 52 can be referred to as a metal fill. The metal fill 52 can be, e.g., tungsten (W) or cobalt (Co) with silicide metal liner such as titanium (Ti) and titanium nitride (TiN). The top surface of the metal fill 52 can be flush with the top surface of the ILD 42. The metal fill 52 directly contacts the top surface of the TS contacts 38 and the sidewalls of the sacrificial spacers 34. Any suitable conducting material can be employed, including but not limited to, e.g., tungsten (W), cobalt (Co), copper (Cu), nickel (Ni), titanium (Ti), tantalum (Ta), ruthenium (Ru), or any suitable combination of those materials. A liner material (e.g., titanium nitride (TiN), or tantalum nitride (TaN)) can also be deposited on the sidewalls of CA and CB openings first before metal fill 52.

Figure 16:
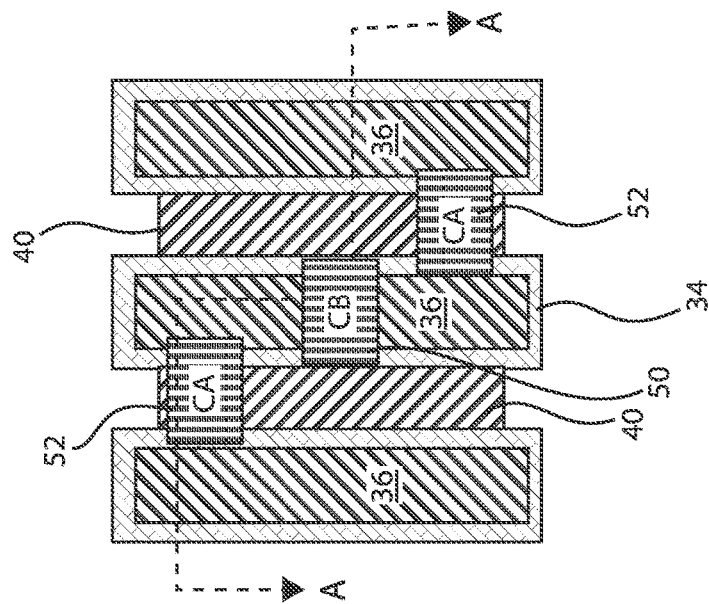
FIG. 16 is a top view of FIG. 15 illustrating the metal fill, in accordance with an embodiment of the present invention.

FIG. 16 is a top view of FIG. 15 illustrating the metal fill, in accordance with an embodiment of the present invention.

The top view illustrates the metal fill 52 for the CA1 and CA2 contacts.

Figure 17:
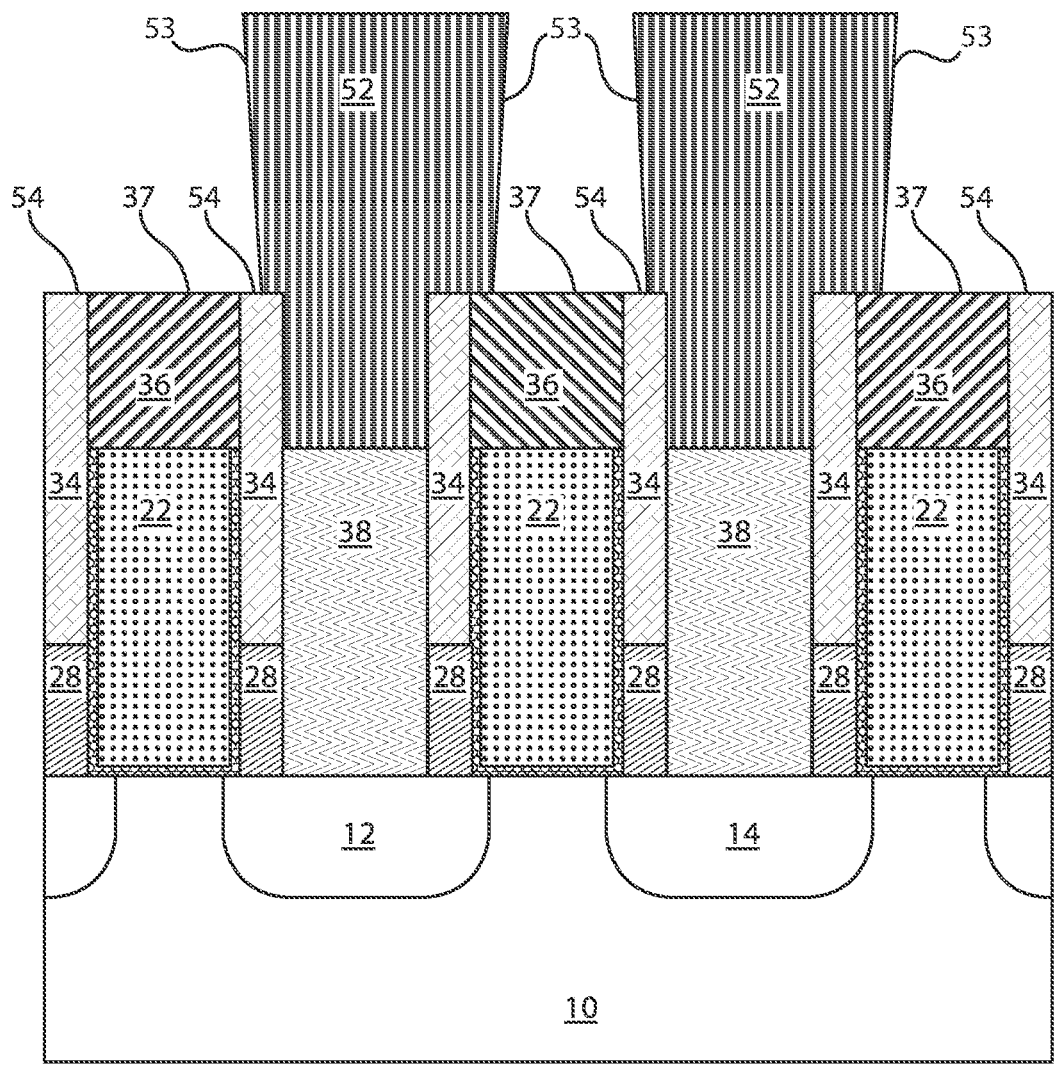
FIG. 17 is a cross-sectional view of the semiconductor structure of FIG. 15 where the ILD is removed to expose a top surface of the sacrificial spacers along axis A-A, in accordance with an embodiment of the present invention.

FIG. 17 is a cross-sectional view of the semiconductor structure of FIG. 15 where the ILD is removed to expose a top surface of the sacrificial spacers along axis A-A, in accordance with an embodiment of the present invention.

In various exemplary embodiments, the ILD 42 is removed to expose a top surface 54 of the sacrificial spacers 34 and a top surface 37 of the first dielectric 36 (or metal gate cap). The removal of the ILD 42 also exposes the sidewalls 53 of the metal fill 52.

Figure 18:
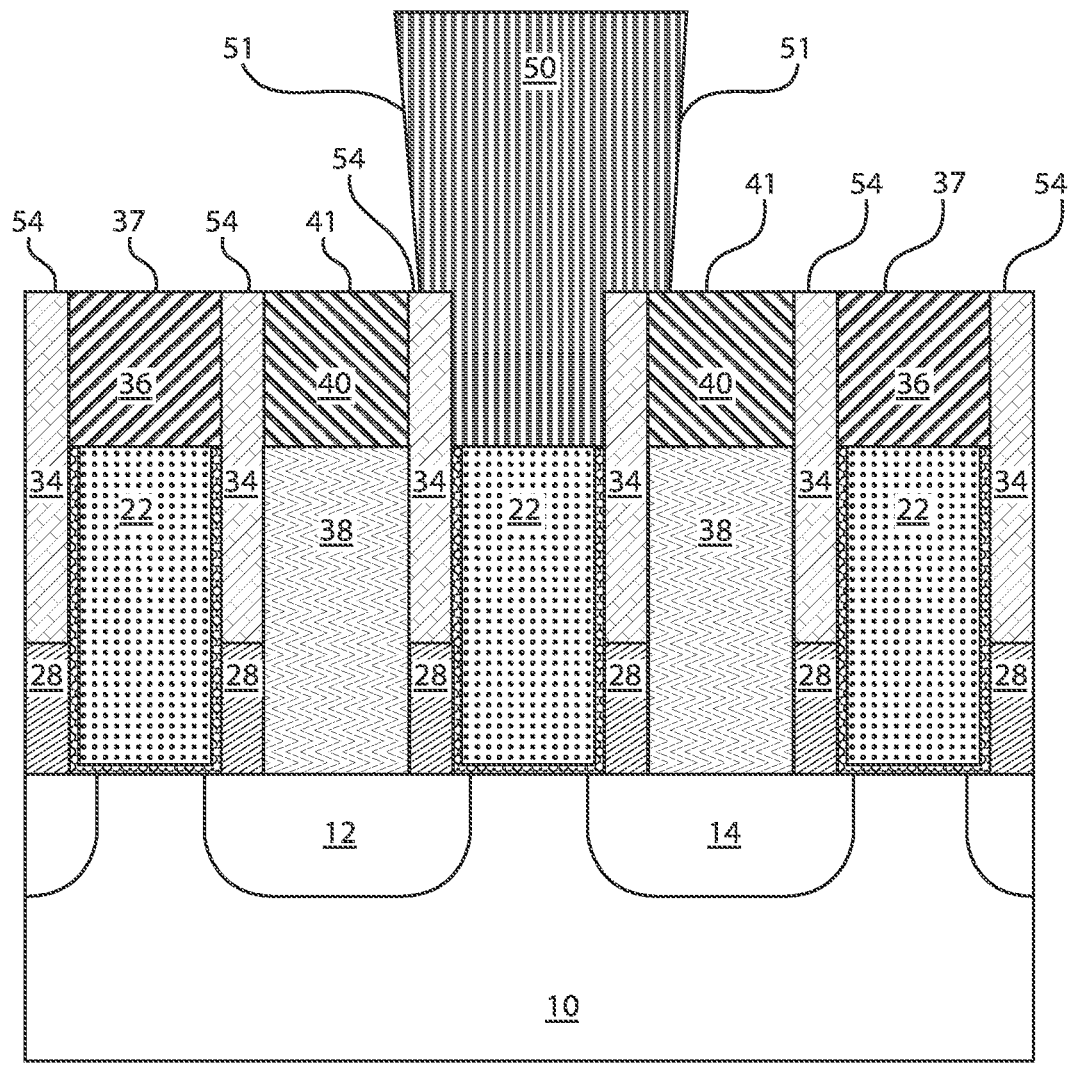
FIG. 18 is a cross-sectional view of the semiconductor structure of FIG. 13 where the ILD is removed to expose a top surface of the sacrificial spacers along axis B-B, in accordance with an embodiment of the present invention.

FIG. 18 is a cross-sectional view of the semiconductor structure of FIG. 13 where the ILD is removed to expose a top surface of the sacrificial spacers along axis B-B, in accordance with an embodiment of the present invention.

In various exemplary embodiments, the ILD 42 is removed to expose a top surface 54 of the sacrificial spacers 34, a top surface 37 of the first dielectric 36 (or metal gate cap), and a top surface 41 of the second dielectric 40 (or TS caps). The removal of the ILD 42 also exposes the sidewalls 51 of the metal fill 50.

Figure 19:
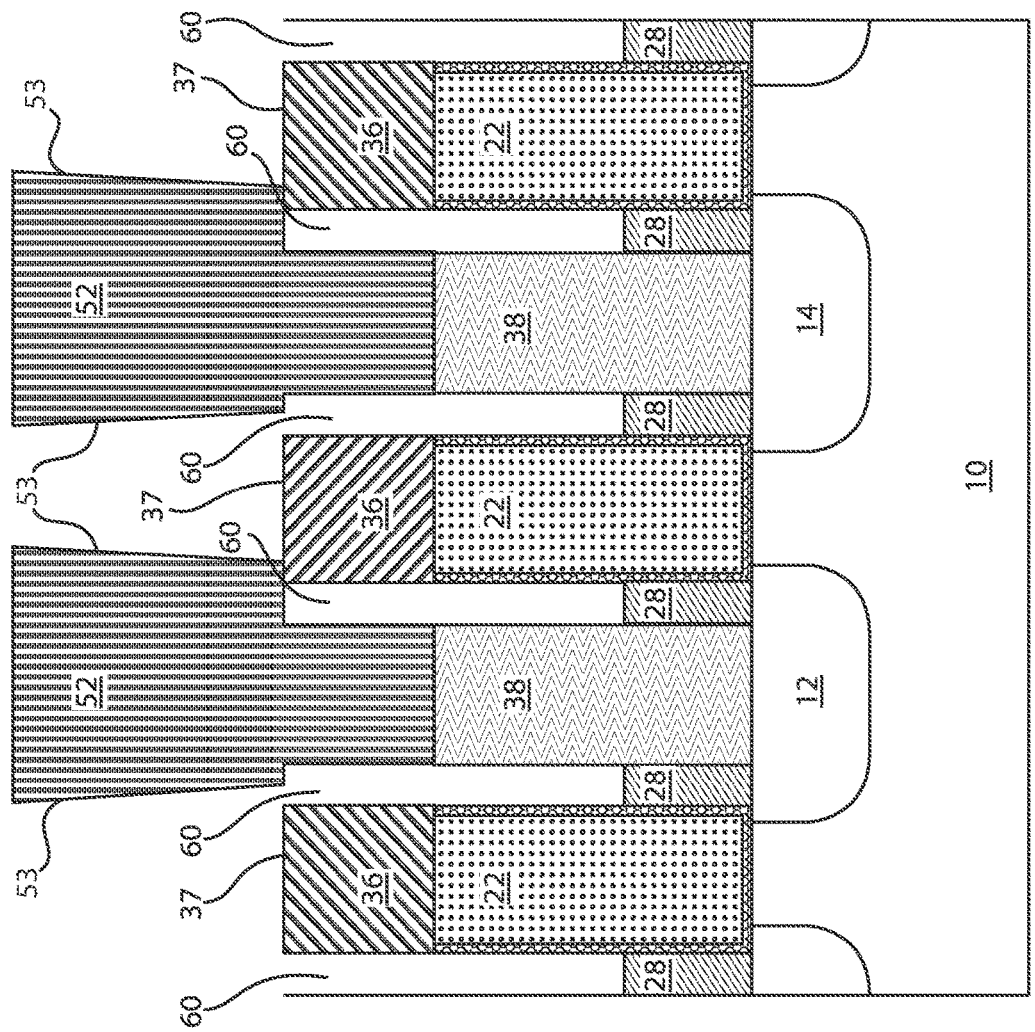
FIG. 19 is a cross-sectional view of the semiconductor structure of FIG. 17 where the sacrificial spacers are removed to form gaps between the TS contacts and the HKMG along axis A-A, in accordance with an embodiment of the present invention.

FIG. 19 is a cross-sectional view of the semiconductor structure of FIG. 17 where the sacrificial spacers are removed to form gaps between the TS contacts and the HKMG along axis A-A, in accordance with an embodiment of the present invention.

Figure 23:
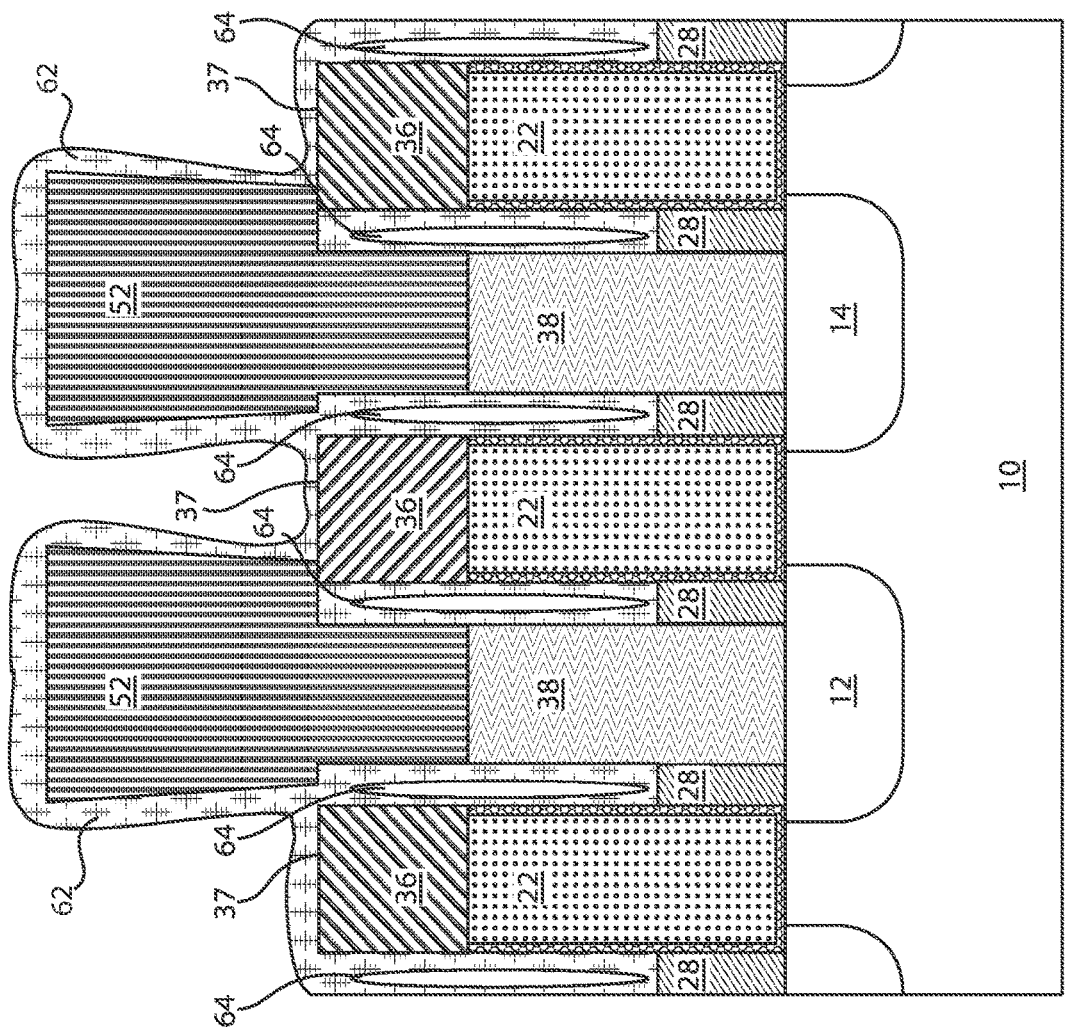
FIG. 23 is a cross-sectional view of the semiconductor structure of FIG. 19 where non-conformal dielectric deposition takes place to form air spacers along axis A-A, in accordance with an embodiment of the present invention.
Figure 25:
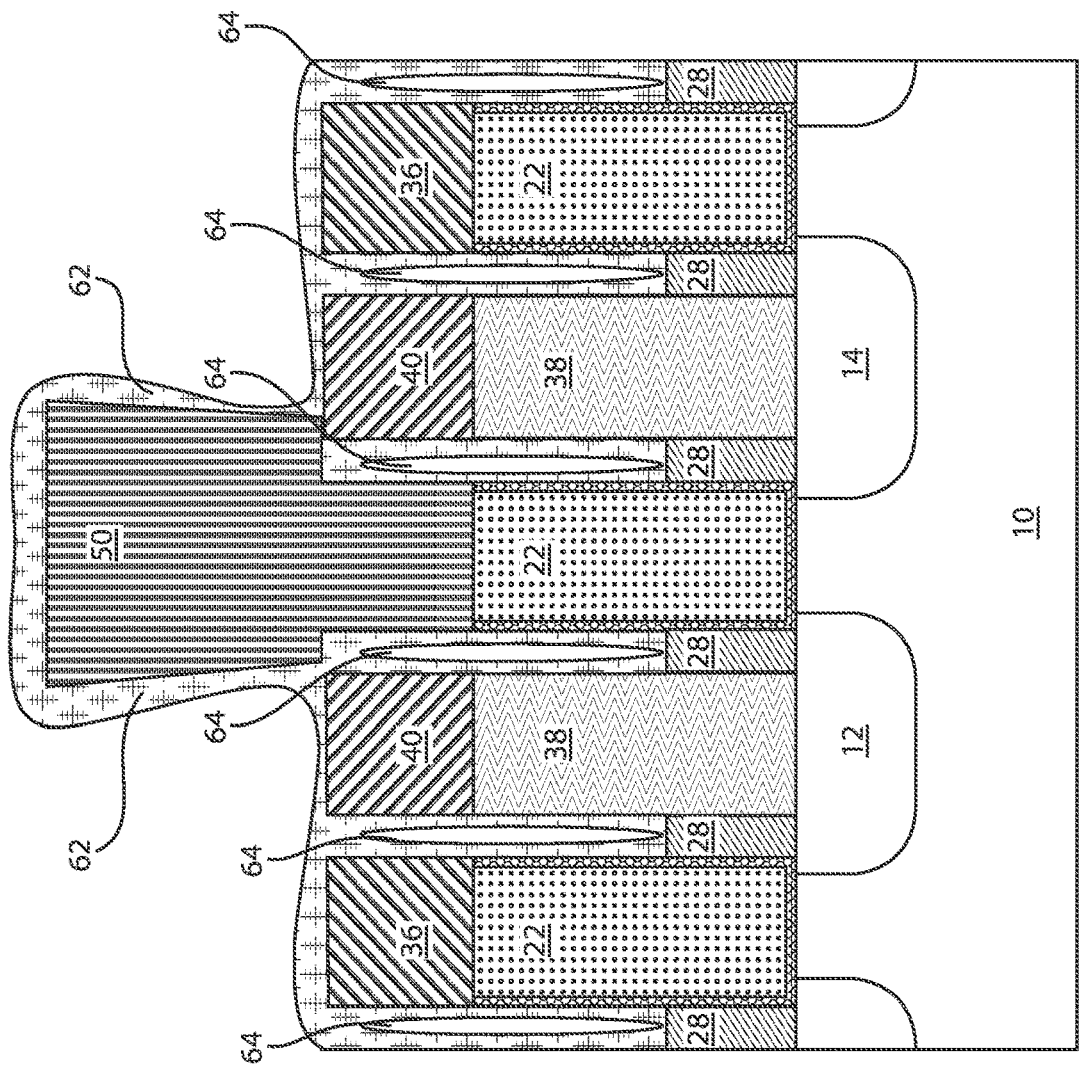
FIG. 25 is a cross-sectional view of the semiconductor structure of FIG. 21 where non-conformal dielectric deposition takes place to form air spacers along axis B-B, in accordance with an embodiment of the present invention.

In various exemplary embodiments, the sacrificial spacers 34 are removed to form divots or gaps 60 between the TS contacts 38 and the HKMG 20, 22. The gaps 60 result in the exposure of a top surface of the recessed spacers 28. The sacrificial spacers 34 can be removed by, e.g., ammonia etch. Thus, an a-Si sacrificial material is employed to replace a part of spacers so that robust gate contact can be formed on top of active region without breaching the spacer. The a-Si upper portion is then removed to form air-gaps or air spacers (FIGS. 23, 25). The a-Si can be removed by any suitable processing, for example, wet etch processing containing ammonia or silicon dry etch process. The a-Si etch process is selective to other surrounding materials.

Figure 20:
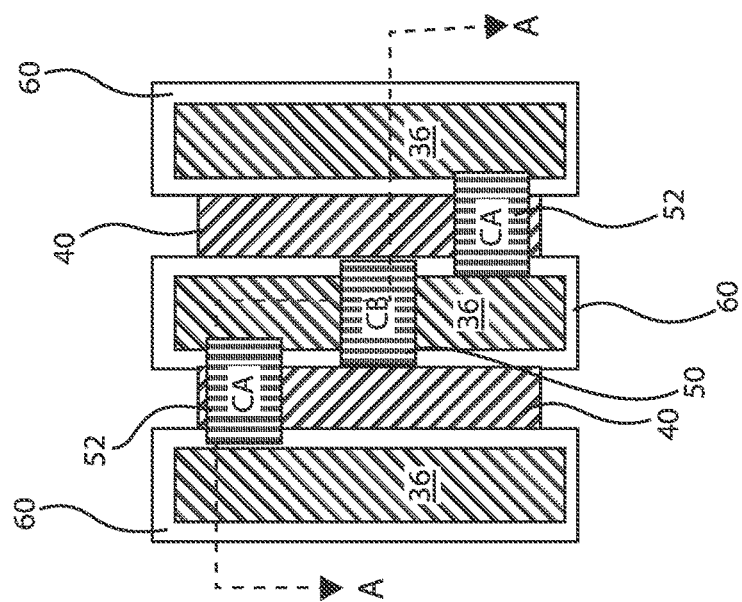
FIG. 20 is a top view of FIG. 19 illustrating the removal of the sacrificial spacers, in accordance with an embodiment of the present invention.

FIG. 20 is a top view of FIG. 19 illustrating the removal of the sacrificial spacers, in accordance with an embodiment of the present invention.

The top view illustrates the divots or gaps 60 formed adjacent the contacts CA1, CA2, CB.

Figure 21:
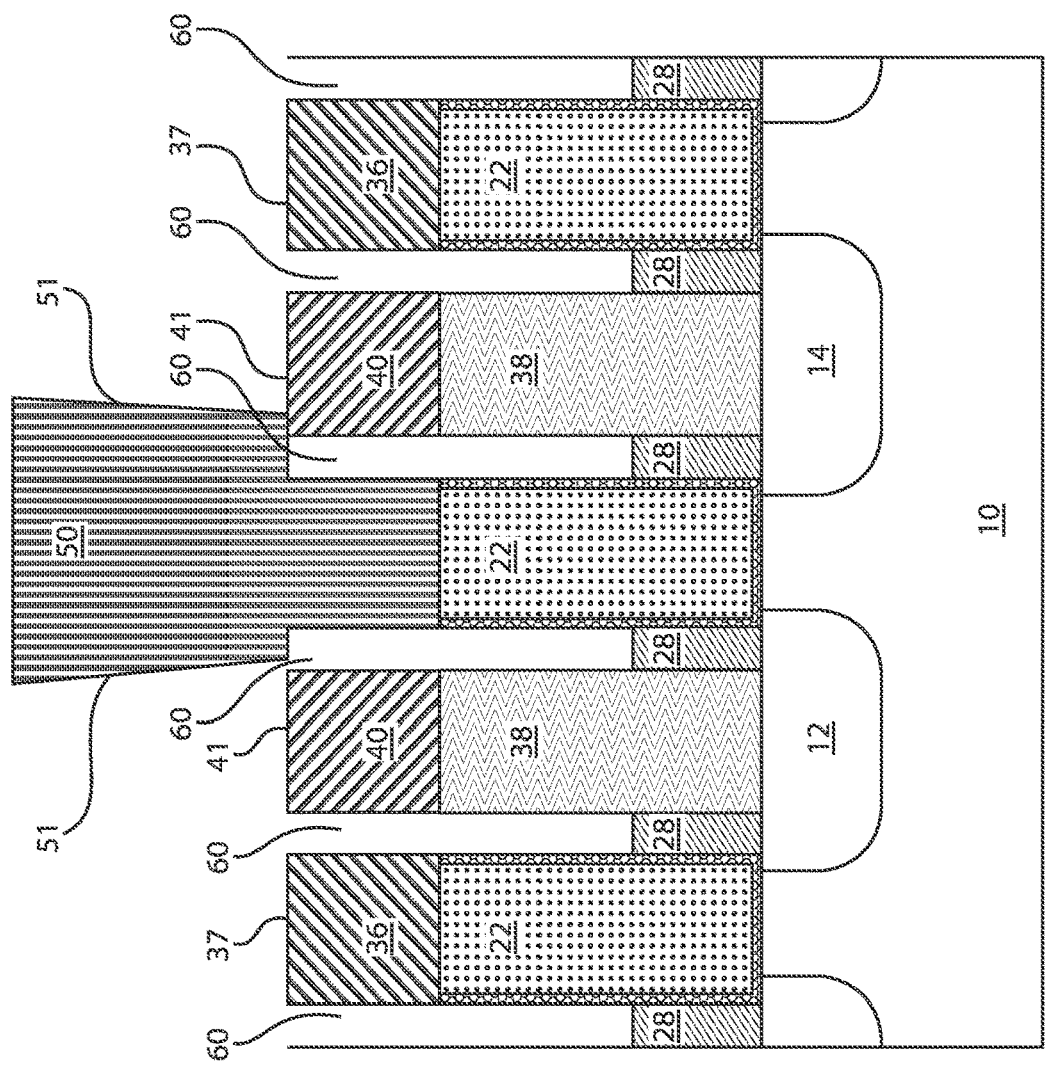
FIG. 21 is a cross-sectional view of the semiconductor structure of FIG. 18 where the sacrificial spacers are removed to form gaps between the TS contacts and the HKMG along axis B-B, in accordance with an embodiment of the present invention.

FIG. 21 is a cross-sectional view of the semiconductor structure of FIG. 18 where the sacrificial spacers are removed to form gaps between the TS contacts and the HKMG along axis B-B, in accordance with an embodiment of the present invention.

In various exemplary embodiments, the sacrificial spacers 34 are removed to form divots or gaps 60 between the TS contacts 38 and the HKMG 20, 22. The gaps 60 result in the exposure of a top surface of the recessed spacers 28. The sacrificial spacers 34 can be removed by, e.g., ammonia etch. Thus, an a-Si sacrificial material is employed to replace a part of spacers so that robust gate contact can be formed on top of active region without breaching the spacer. The a-Si upper portion is then removed to form air-gaps or air spacers (FIGS. 23, 25).

Figure 22:
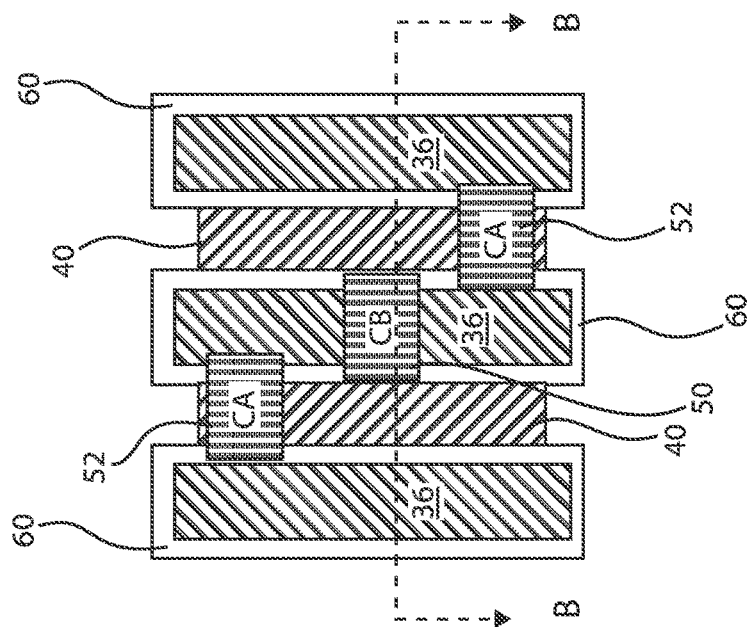
FIG. 22 is a top view of FIG. 21 illustrating the removal of the sacrificial spacers, in accordance with an embodiment of the present invention.

FIG. 22 is a top view of FIG. 21 illustrating the removal of the sacrificial spacers, in accordance with an embodiment of the present invention.

The top view illustrates the divots or gaps 60 formed adjacent the contacts CA1, CA2, CB.

FIG. 23 is a cross-sectional view of the semiconductor structure of FIG. 19 where non-conformal dielectric deposition takes place to form air spacers along axis A-A, in accordance with an embodiment of the present invention.

In various exemplary embodiments, non-conformal dielectric deposition takes place to form air spacers. The dielectric 62 can be e.g., SiN. The dielectric 62 surrounds or covers metal fill 52 (as well as the first and second dielectric 36, 40). The dielectric 62 is pinched off to create air-gaps 64 between the TS contacts 38 and the HKMG 20, 22. The air-gaps 64 are substantially aligned with the recessed spacers 28. The air-gaps 64 reduce gate-TS parasitic capacitance. The air-gaps 64 extend parallel to a portion of the HKMGs 20, 22 and parallel to a portion of the first and second dielectrics 36, 40 (metal gate caps and TS caps). Therefore, the sacrificial upper portion 34 of the stacked spacer enables physical isolation between the CA contacts 52 and the CB contacts 50.

The pinch-off deposition approach allows for pinch-off to occur at the upper ends of the metal gate cap 36 to create the air-gaps 64 between the TS contacts 38 and the HKMG 20, 22. The pinch-off dielectric can include, e.g., SiN, SiCN, SiCOH, carbon doped silicon oxide (pSiCOH), $SiO_2$ in the formation of the air spacers/air gaps 64. Therefore, air-gap formation can be achieved by employing dielectric deposition (by pinch-off of the dielectric layer). The selection of these dielectric materials and processes has an impact in the voids (or gaps 64) dimension and volume. The pinch off dielectric can be deposited by any suitable deposition technique, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RT-CVD), in-situ radical assisted deposition, limited reaction processing CVD (LRPCVD), sputtering, evaporation, spin-on-coating, ion beam deposition, electron beam deposition, laser assisted deposition, chemical solution deposition, or any combination of those methods. The overall void dimension and type of dielectric material are related to the total device capacitance reduction and reliability. Significant capacitance reduction with good reliability can be achieved by introducing voids in spacers through material, process, and structural/architectural optimization with the pinch-off deposition process approach described herein.

Figure 24:
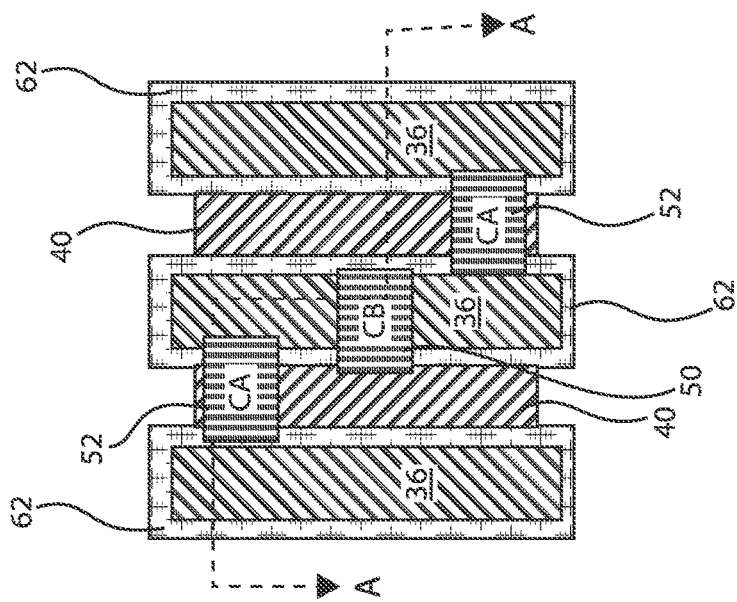
FIG. 24 is a top view of FIG. 23 illustrating the deposited non-conformal dielectric, in accordance with an embodiment of the present invention.

FIG. 24 is a top view of FIG. 23 illustrating the deposited non-conformal dielectric, in accordance with an embodiment of the present invention.

The top view illustrates the dielectric 62 over the metal gate caps 36.

FIG. 25 is a cross-sectional view of the semiconductor structure of FIG. 21 where non-conformal dielectric deposition takes place to form air spacers along axis B-B, in accordance with an embodiment of the present invention.

In various exemplary embodiments, non-conformal dielectric deposition takes place to form air spacers. The dielectric 62 can be e.g., SiN. The dielectric 62 surrounds or covers metal fill 50 (as well as the first and second dielectric 36, 40). The dielectric 62 is pinched off to create air-gaps 64 between the TS contacts 38 and the HKMG 20, 22. The air-gaps 64 are substantially aligned with the recessed spacers 28. The air-gaps 64 reduce gate-TS parasitic capacitance. The pinch-off deposition approach allows for pinch-off to occur at the upper ends of the metal gate cap 36 to create the air-gaps 64 between the TS contacts 38 and the HKMG 20, 22. As a result, after formation of the CA and CB contacts 50, 52, the sacrificial a-Si spacer 34 is removed and a dielectric 62 is deposited to fill the spacer openings to form the air spacers 64, thus reducing parasitic capacitance between the metal gates 22 and the TS contacts 38.

Figure 26:
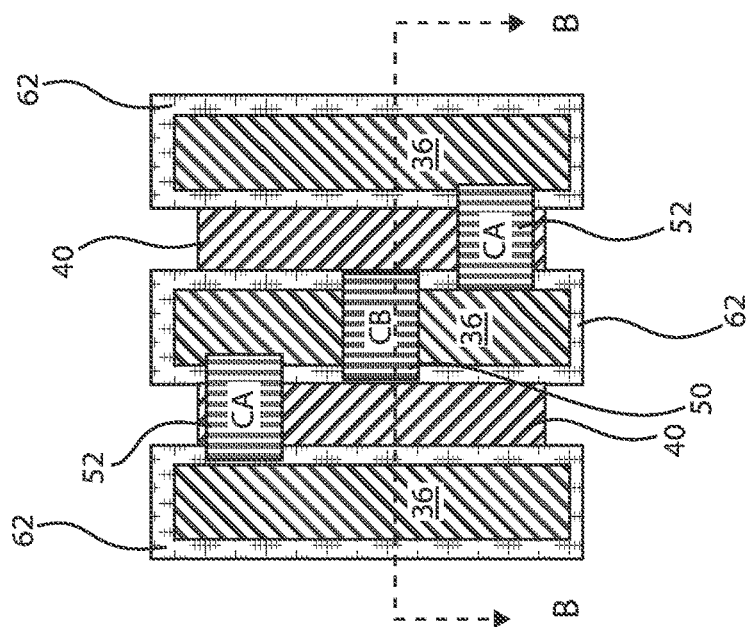
FIG. 26 is a top view of FIG. 25 illustrating the deposited non-conformal dielectric, in accordance with an embodiment of the present invention.

FIG. 26 is a top view of FIG. 25 illustrating the deposited non-conformal dielectric, in accordance with an embodiment of the present invention.

The top view illustrates the dielectric 62 over the metal gate caps 36.

Figure 27:
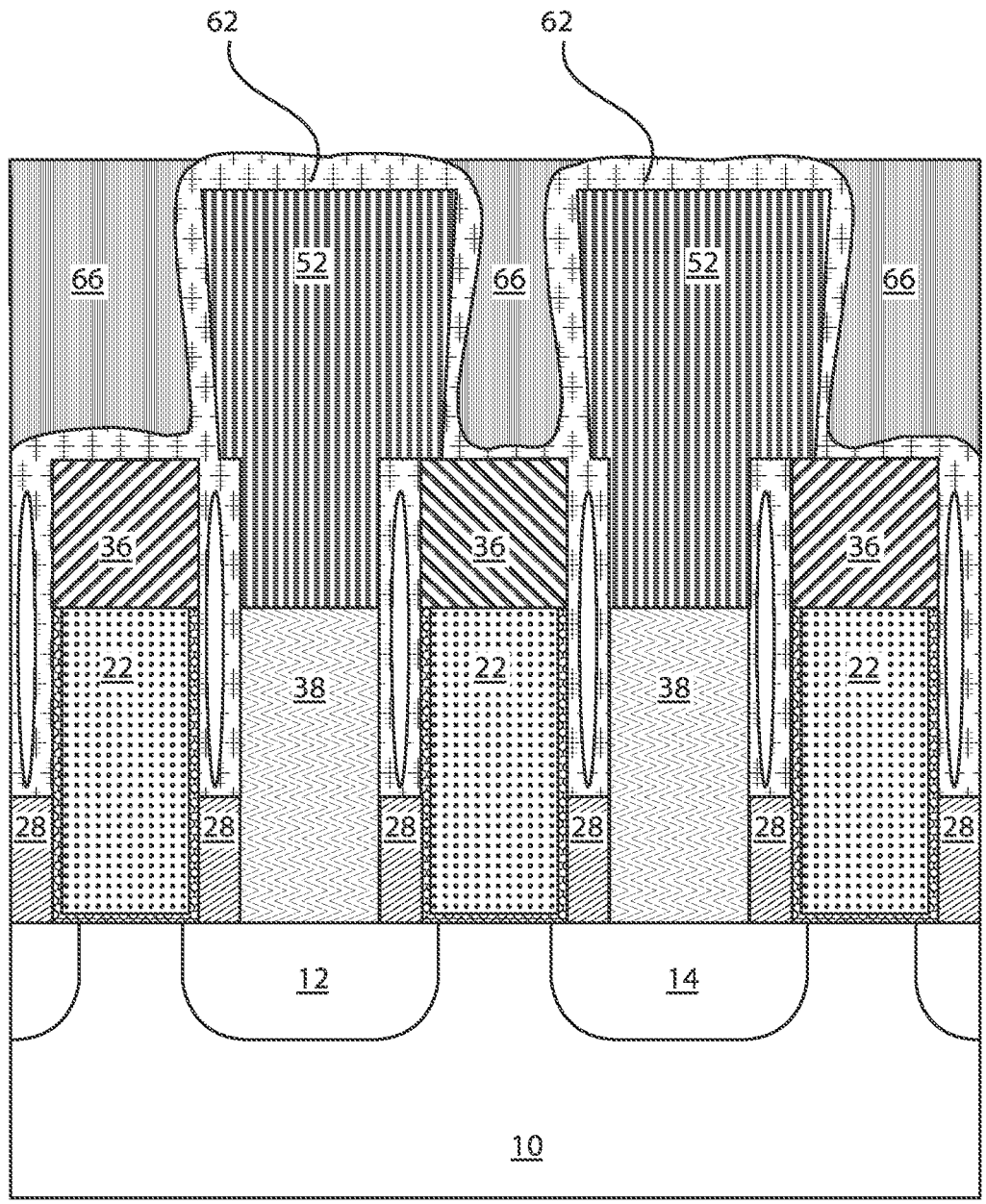
FIG. 27 is a cross-sectional view of the semiconductor structure of FIG. 23 where an additional dielectric is deposited over the non-conformal dielectric along axis A-A, in accordance with an embodiment of the present invention.

FIG. 27 is a cross-sectional view of the semiconductor structure of FIG. 23 where an additional dielectric is deposited over the non-conformal dielectric along axis A-A, in accordance with an embodiment of the present invention.

In various exemplary embodiments, an additional dielectric 66 is deposited over the conformal dielectric 62. The dielectric 66 can be an ILD. The height of the ILD 66 can be reduced by chemical-mechanical polishing (CMP) and/or etching.

Figure 28:
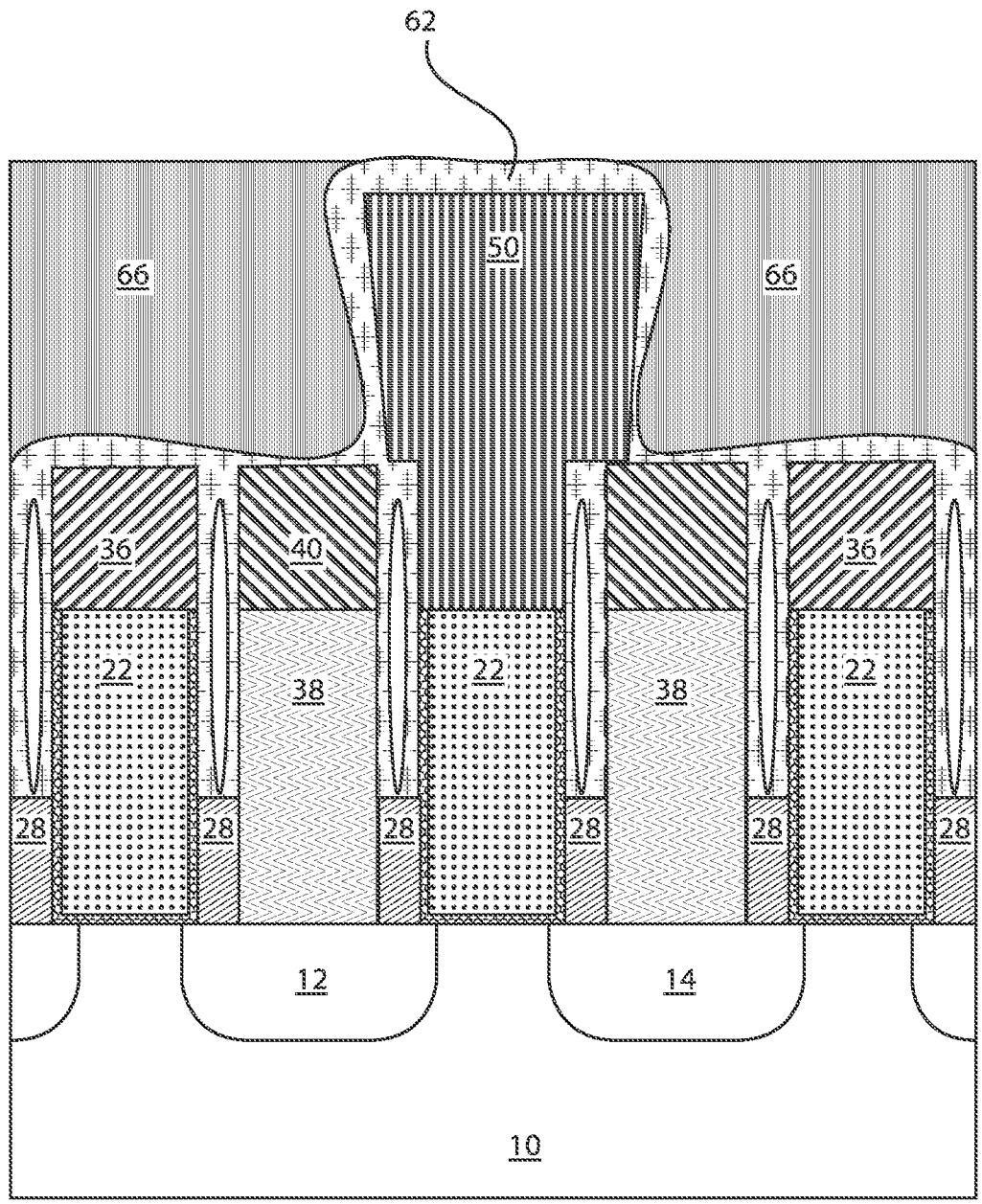
FIG. 28 is a cross-sectional view of the semiconductor structure of FIG. 25 where an additional dielectric is deposited over the non-conformal dielectric along axis B-B, in accordance with an embodiment of the present invention.

FIG. 28 is a cross-sectional view of the semiconductor structure of FIG. 25 where an additional dielectric is deposited over the non-conformal dielectric along axis B-B, in accordance with an embodiment of the present invention.

In various exemplary embodiments, an additional dielectric 66 is deposited over the conformal dielectric 62. The dielectric 66 can be an ILD. The height of the ILD 66 can be reduced by chemical-mechanical polishing (CMP) and/or etching.

Therefore, the sacrificial spacers 34 can serve a dual purpose. For instance, contact over active gate (COAG) can be employed to increase transistor density and an air spacer or air-gaps can be employed to reduce parasitic capacitance. The final structure shown in FIGS. 27 and 28 illustrates the non-conformal SiN as it wraps around or covers or encompasses the CA and CB contacts. The COAG enables the increase of transistor density on a chip because the gate contact is placed directly on top of the active area. Moreover, spacer erosion is prevented by employing a stacked spacer (corners remain intact). The top portion of the spacer is sacrificial and can be constructed from a semiconductor, such as, e.g., a-Si. The bottom portion of the spacer is constructed from, e.g., a low-k dielectric. Due to the excellent etch selectivity between dielectric materials (e.g., gate cap and TS cap) to a-Si, the a-Si sacrificial spacer ensures physical isolation between the CA and CB contacts. As a result, the sacrificial a-Si spacer (upper spacer portion of the spacer stack) serves the purposes of enabling gate contact over active with improved process margin and can act as a placeholder for forming air spacers or air-gaps.

In conclusion, continued integrated circuit scaling deeper into the nanoscale regime has provided improved performance through shrinking of the Front-End-of-Line (FEOL) device and Back-End-of-Line (BEOL) interconnect. With scaling, resistance-capacitance (RC) delay is an increasing challenge, limiting overall product performance. Capacitance reduction is therefore important for device performance in both the FEOL and BEOL device structure. Conventional capacitance reduction methods for FEOL and BEOL while maintaining yield and reliability have needed significant material innovations such lower-k cap and bulk dielectrics with desired mechanical, structural, electrical and other properties. To further improve capacitance, other innovations in device structure and process integration are needed, such as air gaps and air spacers described in accordance with the exemplary embodiments of the present invention. The air spacer and air gap structures described herein employ pinch-off deposition to optimize the capacitance reduction while maintaining yield and reliability.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing parasitic capacitance between gate structures and source/drain regions (TS contacts) by forming air-gaps or air-gap spacers there between (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for employing contact over active gate to reduce parasitic capacitance, the semiconductor structure comprising:
   high-k metal gates (HKMGs) disposed between stacked spacers;
   a first dielectric disposed over the HKMGs;
   first contacts directly contacting source/drain regions of a transistor;
   a second dielectric disposed over second contacts;
   the second contacts and third contacts created after selective removal of the first and second dielectrics, respectively; and
   a third dielectric disposed over the remaining first and second dielectrics to create air-gaps on opposed ends of the first contact aligned over a common source/drain region and extending above a top surface of the first contact, wherein a portion of each of the third contacts extends over the air-gaps.

2. The semiconductor structure of claim 1, wherein the stacked spacers include a low-k dielectric lower portion and a sacrificial upper portion.

3. The semiconductor structure of claim 2, wherein the low-k dielectric lower portion defines a first length and the sacrificial upper portion defines a second length, where the second length is greater than the first length.

4. The semiconductor structure of claim 3, wherein the first dielectric has a first thickness and the second dielectric has a second thickness, the first and second thickness being different from each other.

5. The semiconductor structure of claim 4, wherein the sacrificial upper portion is constructed from amorphous silicon (a-Si).

6. The semiconductor structure of claim 5, wherein the sacrificial upper portion enables physical isolation between the second and third contacts.

7. The semiconductor structure of claim 1, wherein the air-gaps extend parallel to a portion of the HKMGs.

8. The semiconductor structure of claim 1, wherein the air-gaps extend parallel to a portion of the first and second dielectrics.

9. The semiconductor structure of claim 1, wherein the air-gaps are created between the first contacts and the HKMGs.

10. The semiconductor structure of claim 1, wherein the third dielectric wraps around the first and second dielectrics.

11. A semiconductor structure for employing contact over active gate to reduce parasitic capacitance, the semiconductor structure comprising:
first contacts vertically offset from a first dielectric;
a second dielectric disposed over second contacts;
the second contacts and third contacts created after selective removal of the first and second dielectrics, respectively; and
a third dielectric disposed over the remaining first and second dielectrics to create air-gaps on opposed ends of the first contact aligned over a common source/drain region and extending above a top surface of the first contact, wherein a portion of each of the third contacts extends over the air-gaps.

12. The semiconductor structure of claim 11, wherein the first dielectric is disposed over and in direct contact with high-k metal gates (HKMGs).

13. The semiconductor structure of claim 12, wherein the HKMGs are disposed between stacked spacers.

14. The semiconductor structure of claim 13, wherein the first contacts directly contact source/drain regions.

15. The semiconductor structure of claim 14, wherein the first dielectric has a first thickness and the second dielectric has a second thickness, the first and second thickness being different from each other.

16. The semiconductor structure of claim 15, wherein the air-gaps extend parallel to a portion of the HKMGs.

17. The semiconductor structure of claim 16, wherein the air-gaps are created between the first contacts and the HKMGs.

18. The semiconductor structure of claim 11, wherein the air-gaps extend parallel to a portion of the first and second dielectrics.

19. The semiconductor structure of claim 11, wherein the air-gaps have a substantially elongated configuration.

20. The semiconductor structure of claim 11, wherein the third dielectric wraps around the first and second dielectrics.

* * * * *